(12) United States Patent
Wang et al.

(10) Patent No.: US 9,159,749 B2
(45) Date of Patent: Oct. 13, 2015

(54) OXIDE SEMICONDUCTOR DEVICES, METHODS OF MANUFACTURING OXIDE SEMICONDUCTOR DEVICES, DISPLAY DEVICES HAVING OXIDE SEMICONDUCTOR DEVICES, METHODS OF MANUFACTURING DISPLAY DEVICES HAVING OXIDE SEMICONDUCTOR DEVICES

(71) Applicant: SAMSUNG DISPLAY CO., LTD., Yongin, Gyeonggi-Do (KR)

(72) Inventors: Seong-Min Wang, Yongin (KR); Ki-Wan Ahn, Yongin (KR); Joo-Sun Yoon, Yongin (KR); Ki-Hong Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/533,009

(22) Filed: Nov. 4, 2014

(65) Prior Publication Data

US 2015/0132871 A1   May 14, 2015

Related U.S. Application Data

(62) Division of application No. 13/229,606, filed on Sep. 9, 2011, now abandoned.

(30) Foreign Application Priority Data

May 17, 2011   (KR) .................. 10-2011-0046116

(51) Int. Cl.
*H01L 29/786*   (2006.01)
*H01L 21/336*   (2006.01)
(Continued)

(52) U.S. Cl.
CPC ........ *H01L 27/1259* (2013.01); *H01L 21/0206* (2013.01); *H01L 21/32136* (2013.01);
(Continued)

(58) Field of Classification Search
CPC ............... H01L 29/7869; H01L 29/78696; H01L 29/4908; H01L 29/78618; H01L 27/1225; H01L 21/0206–21/02074; H01L 21/32136–21/32138
See application file for complete search history.

(56) References Cited

U.S. PATENT DOCUMENTS 7,118,937 B2    10/2006   Jang et al.
7,576,394 B2 *   8/2009   Furuta et al. .................. 257/347
(Continued)

FOREIGN PATENT DOCUMENTS

CN    101326644 A    12/2008
JP    08-236775        9/1996
(Continued)

OTHER PUBLICATIONS

European Extended Search Report dated Sep. 7, 2012 for corresponding EP Application No. 11190716.8, 7 pages.
(Continued)

*Primary Examiner* — Marvin Payen
*Assistant Examiner* — Jeremy Joy
(74) *Attorney, Agent, or Firm* — Christie, Parker & Hale, LLP

(57) ABSTRACT

An oxide semiconductor device includes a gate electrode on a substrate, a gate insulation layer on the substrate, the gate insulation layer having a recess structure over the gate electrode, a source electrode on a first portion of the gate insulation layer, a drain electrode on a second portion of the gate insulation layer, and an active pattern on the source electrode and the drain electrode, the active pattern filling the recess structure.

13 Claims, 19 Drawing Sheets

(51) Int. Cl.

| | | |
|---|---|---|
| *H01L 27/12* | (2006.01) | |
| *H01L 29/66* | (2006.01) | |
| *H01L 21/467* | (2006.01) | |
| *H01L 21/477* | (2006.01) | |
| *H01L 21/44* | (2006.01) | |
| *H01L 29/49* | (2006.01) | |
| *H01L 21/02* | (2006.01) | |
| *H01L 21/3213* | (2006.01) | |

(52) U.S. Cl.
CPC .............. *H01L21/44* (2013.01); *H01L 21/467* (2013.01); *H01L 21/477* (2013.01); *H01L 27/1225* (2013.01); *H01L 29/4908* (2013.01); *H01L 29/66969* (2013.01); *H01L 29/7869* (2013.01); *H01L 29/78618* (2013.01); *H01L 29/78696* (2013.01); *H01L 2227/323* (2013.01)

(56) References Cited

U.S. PATENT DOCUMENTS

| | | | | |
|---|---|---|---|---|
| 8,110,436 | B2* | 2/2012 | Hayashi et al. | 438/104 |
| 8,441,007 | B2* | 5/2013 | Arai | 257/43 |
| 2002/0117719 | A1 | 8/2002 | Ando et al. | |
| 2003/0235996 | A1* | 12/2003 | Leon et al. | 438/710 |
| 2005/0199959 | A1* | 9/2005 | Chiang et al. | 257/368 |
| 2007/0187678 | A1* | 8/2007 | Hirao et al. | 257/43 |
| 2008/0038882 | A1* | 2/2008 | Takechi et al. | 438/151 |
| 2009/0236596 | A1* | 9/2009 | Itai | 257/43 |
| 2009/0269881 | A1 | 10/2009 | Furuta et al. | |
| 2009/0305468 | A1* | 12/2009 | Jung et al. | 438/151 |
| 2009/0315590 | A1* | 12/2009 | Yin et al. | 326/119 |
| 2009/0321732 | A1* | 12/2009 | Kim et al. | 257/43 |
| 2010/0059746 | A1* | 3/2010 | Itai | 257/43 |
| 2010/0117076 | A1* | 5/2010 | Akimoto et al. | 257/43 |
| 2010/0117077 | A1* | 5/2010 | Yamazaki et al. | 257/43 |
| 2010/0117086 | A1* | 5/2010 | Akimoto et al. | 257/57 |

FOREIGN PATENT DOCUMENTS

| | | |
|---|---|---|
| JP | 2003-068755 | 3/2003 |
| JP | 2006-165529 | 6/2006 |
| JP | 2006-332604 | 12/2006 |
| JP | 2006-332614 | 12/2006 |
| JP | 2010-135772 | 6/2010 |
| JP | 2010-135780 | 6/2010 |
| KR | 1998-0005758 | 3/1998 |
| KR | 1020050080503 A | 8/2005 |
| KR | 100814901 B1 | 3/2008 |
| KR | 1020080082277 A | 9/2008 |
| KR | 1020090091868 A | 8/2009 |

OTHER PUBLICATIONS

SIPO Office Action dated Jul. 1, 2014 for corresponding CN Application No. 201210025075.6, 17 pages.

* cited by examiner

OXIDE SEMICONDUCTOR DEVICES, METHODS OF MANUFACTURING OXIDE SEMICONDUCTOR DEVICES, DISPLAY DEVICES HAVING OXIDE SEMICONDUCTOR DEVICES, METHODS OF MANUFACTURING DISPLAY DEVICES HAVING OXIDE SEMICONDUCTOR DEVICES

CROSS-REFERENCE TO RELATED APPLICATION(S)

This application is a divisional of U.S. patent application Ser. No. 13/229,606, filed Sep. 9, 2011, which claims priority under 35 USC §119 to Korean Patent Application No. 2011-46116 filed on May 17, 2011 in the Korean Intellectual Property Office (KIPO), the contents of which are herein incorporated by reference in their entirety.

BACKGROUND

1. Field

Embodiment of the present invention relate to oxide semiconductor devices, methods of manufacturing oxide semiconductor devices, display devices having oxide semiconductor devices, and methods of manufacturing display devices including oxide semiconductor devices. More particularly, embodiments relate to oxide semiconductor devices including gate insulation layers having recess structures, methods of manufacturing the oxide semiconductor devices including the gate insulation layers having the recess structures, display devices including the oxide semiconductor devices, and methods of manufacturing display devices having the oxide semiconductor devices.

2. Description of Related Art

A conventional bottom gate type thin film transistor (TFT) includes a gate electrode disposed on a substrate, a gate insulation layer located on the gate electrode, a source electrode and a drain electrode positioned on the gate insulation layer, and an active layer contacting the source and drain electrodes and the gate insulation layer between the source and drain electrodes.

In manufacturing the conventional bottom gate type thin film transistor, a metal layer is formed on the gate insulation layer to form the source electrode and the drain electrode, and an internal stress may be generated in the gate insulation layer while forming the metal layer on the gate insulation layer. When an active layer is formed on a gate insulation layer having internal stress, voltage-current characteristics of the transistor may be deteriorated. Additionally, etching damage is easily generated on a surface of the gate insulation layer while patterning the metal layer for forming the source and drain electrodes. Furthermore, the gate insulation layer is frequently contaminated by etching such as metal compounds and metallic particles generated in an etching process for the metal layer. Thus, an interface between the active layer and the gate insulation layer may be irregular, thereby deteriorating electrical characteristics of the transistor. For example, the transistor may have poor electrical characteristics such as increased variation of threshold voltages (Vth), decreased charge mobility, reduced operation current (Ion), etc. When an oxide semiconductor device includes a gate insulation layer having an internal stress, etching damage, and/or etching by-products remaining thereon, the oxide semiconductor device may have deteriorated electrical characteristics, such that the oxide semiconductor devices having the deteriorated electrical characteristics may not be suitable for use in display devices such as a liquid crystal display (LCD) device or an organic light emitting display (OLED) device.

SUMMARY

Aspects of embodiments of the present invention provide oxide semiconductor devices including gate insulation layers having recess structures to improve electrical characteristics.

Aspects of embodiments of the present invention provide methods of manufacturing oxide semiconductor devices including gate insulation layers having recess structures for enhancing electrical characteristics.

Aspects of embodiments of the present invention provide display devices including oxide semiconductor devices having improved electrical characteristics because of recess structures provided on gate insulation layers thereof.

Aspects of embodiments of the present invention provide methods of manufacturing display devices including oxide semiconductor devices having improved electrical characteristics because of recess structures provided on gate insulation layers thereof.

According to example embodiments, an oxide semiconductor device includes a gate electrode on a substrate, a gate insulation layer on the substrate, the gate insulation layer having a recess structure over the gate electrode, a source electrode on a first portion of the gate insulation layer, a drain electrode on a second portion of the gate insulation layer, and an active pattern on the source electrode.

Each of the source electrode and the drain electrode may include a metal, an alloy, a metal nitride, a conductive metal oxide, a transparent conductive material. These may be used alone or in a mixture thereof.

The active pattern may include a semiconductor oxide. The semiconductor oxide may include a binary compound ($AB_x$), a ternary compound ($AB_xC_y$), a quaternary compound ($AB_xC_yD_z$), etc. For example, the semiconductor oxide in the active pattern may include indium (In), zinc (Zn), gallium (Ga), tin (Sn), titanium (Ti), aluminum (Al), hafnium (Hf), zirconium (Zr), magnesium (Mg), etc. These may be used alone or in a mixture thereof.

In example embodiments, the active pattern may additionally include lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), ruthenium (Ru), germanium (Ge), tin (Sn), fluorine (F), etc. These may be used alone or in a mixture thereof.

In example embodiments, the recess structure may be formed by performing at least one of a plasma treatment or a cleaning treatment on the gate insulation layer.

The recess structure may include a sidewall having a first angle of inclination relative to the substrate. Each of the source electrode and the drain electrode may include a sidewall, one of the sidewalls having a second angle of inclination with respect to the substrate. Here, the second angle of inclination may be greater than the first angle of inclination. For example, a ratio between the first angle of inclination and the second angle of inclination may be in a range from about 1.0:0.5 to about 1.0:9.0.

In example embodiments, a lower portion of the active pattern may fill the recess structure and a central portion of the active pattern may contact the source electrode and the drain electrode. An inclined angle, relative to the substrate, of a sidewall of the central portion of the active pattern may be substantially greater than an inclined angle, relative to the substrate, of a sidewall of the lower portion of the active pattern. For example, a ratio between the inclined angle of the sidewall of the lower portion and the inclined angle of the sidewall of the central portion may be in a range from about 1.0:0.5 to about 1.0:9.0.

In some embodiments, the gate insulation layer has a substantially level upper face. A ratio between a depth of the recess structure and a thickness of the gate insulation layer may be in a range from about 1.0:1.7 to about 1.0:30.0.

In some embodiments, the gate insulation layer includes a stepped portion adjacent to the gate electrode. A ratio between a depth of the recess structure and a thickness of the gate insulation layer may be in a range from about 1.0:1.7 to about 1.0:10.0. Further, each of the source electrode and the drain electrode may include a stepped portion adjacent to the stepped portion of the gate insulation layer.

In example embodiments, the source electrode may include a first electrode pattern and a second electrode pattern, and the drain electrode may include a third electrode pattern and a fourth electrode pattern. For example, each of the first electrode pattern and the third electrode pattern may include a metal, an alloy and a transparent conductive material. Further, each of the second electrode pattern and the fourth electrode pattern may include one of a metal nitride and a nitride of a transparent conductive material.

According to example embodiments of the present invention, a method of manufacturing an oxide semiconductor device includes forming a gate electrode on a substrate and forming a gate insulation layer on the substrate to cover the gate electrode. An electrode layer may be formed on the gate insulation layer. A mask pattern may be formed on the electrode layer. A source electrode and a drain electrode may be formed on the gate insulation layer by etching the electrode layer using the mask pattern. A recess structure may be formed on the gate insulation layer and between the source electrode and the drain electrode. An active pattern may be formed on the gate insulation layer, the source electrode and the drain electrode.

In example embodiments, the recess structure may be formed by performing at least one of a plasma treatment or a cleaning treatment. For example, the plasma treatment may be carried out using a plasma generated from a gas such as a gas including sulfur fluoride ($SF_x$), a gas including chlorine fluoride ($ClF_x$), a gas including hydrogen chloride (HCl), a gas including boron chloride ($BCl_x$), a gas including hydrocarbon ($C_xH_y$), a gas including oxygen ($O_2$), a gas including ozone ($O_3$), etc. Additionally, the cleaning treatment may be performed by applying a solution for removing a metal compound. For example, the solution for removing the metal compound may include a solution such as a solution containing hydrogen fluoride (HF), a solution containing hydrogen chloride (HCl), a solution containing phosphoric acid ($H_3PO_4$), a solution containing potassium hydroxide (KOH), a solution containing hydrogen bromide (HBr), a solution containing iodine bromide (IBr), etc.

In example embodiments, the mask pattern may be removed from the source electrode and the drain electrode after forming the recess structure.

In forming the recess structure according to example embodiments, a preliminary recess structure may be formed on the gate insulation layer by performing a plasma treatment on the gate insulation layer between the source electrode and the drain electrode. The mask pattern may be removed from the source electrode and the drain electrode. A cleaning treatment may be performed on the gate insulation layer having the preliminary recess structure.

In forming the recess structure according to example embodiments, a preliminary recess structure may be formed on the gate insulation layer by performing a plasma treatment on the gate insulation layer between the source electrode and the drain electrode. The recess structure may be formed on the gate insulation layer by a cleaning treatment performed on the gate insulation layer having the preliminary recess structure. The mask pattern may be removed from the source electrode and the drain electrode.

In forming the electrode layer according to example embodiments, a first electrode film may be formed on the gate insulation layer, and a second electrode film may be formed on the first electrode film. For example, the second electrode film may be obtained by nitriding the first electrode film.

In example embodiments, the second electrode film may be formed by thermally treating the first electrode film under an atmosphere containing nitrogen and/or by treating the first electrode film with a plasma generated from a gas containing nitrogen.

In forming the source electrode and the drain electrode according to example embodiments, the second electrode film and the first electrode film may be partially etched to form a first electrode pattern and a second electrode pattern on a first portion of the gate insulation layer, and to form a third electrode pattern and a fourth electrode pattern on a second portion of the gate insulation layer.

In forming the recess structure according to example embodiments, the mask pattern from may be removed the source electrode and the drain electrode. A plasma treatment and/or a cleaning treatment may be performed on the gate insulation layer between the source electrode and the drain electrode.

According to example embodiments, there is provided a display device including a substrate, a gate electrode on the substrate, a gate insulation layer on the substrate, a source electrode on a first portion of the gate insulation layer, a drain electrode on a second portion of the gate insulation layer, an active pattern on the source electrode and the drain electrode, a first electrode electrically connected to the drain electrode, a light emitting layer on the first electrode, and a second electrode on the light emitting layer. The gate insulation layer may include a recess structure over the gate electrode, and the active pattern may fill the recess structure;

In example embodiments, the recess structure may have a sidewall having a first angle of inclination relative to the substrate, and each of the source electrode and the drain electrode may have a sidewall having a second angle of inclination with respect to the substrate. The second angle of inclination may be substantially greater than the first angle of inclination.

In example embodiments, a lower portion of the active pattern may fill the recess structure, a central portion of the active pattern may make contact with the source electrode and the drain electrode, and an inclined angle, relative to the substrate, of a sidewall of the central portion of the active pattern may be substantially greater than an inclined angle, relative to the substrate, of a sidewall of the lower portion of the active pattern.

In example embodiments, the gate insulation layer may have a substantially level upper face, and a ratio between a depth of the recess structure and a thickness of the gate insulation layer may be in a range from about 1.0:1.7 to about 1.0:30.0.

In example embodiments, the gate insulation layer may include a stepped portion adjacent to the gate electrode, and a ratio between a depth of the recess structure and a thickness of the gate insulation layer may be in a range from about 1.0:1.7 to about 1.0:10.0.

According to example embodiments, there is provided a method of manufacturing a display device. In the method, a gate electrode may be formed on a substrate. A gate insulation layer may be formed on the substrate to cover the gate electrode. An electrode layer may be formed on the gate insulation layer. A mask pattern may be formed on the electrode layer. A source electrode and a drain electrode may be formed on the gate insulation layer by etching the electrode layer using the mask pattern. A recess structure may be formed on the gate insulation layer and between the source electrode and the drain electrode. An active pattern may be formed on the gate insulation layer, the source electrode and the drain electrode. A first electrode may be formed to be electrically connected to the drain electrode. A light emitting layer may be formed on the first electrode. A second electrode may be formed on the light emitting layer.

In example embodiments, the recess structure may be obtained by performing a plasma treatment and/or a cleaning treatment.

In forming the recess structure according to example embodiments, a preliminary recess structure may be formed on the gate insulation layer by performing a plasma treatment on the gate insulation layer between the source electrode and the drain electrode. The mask pattern may be removed from the source electrode and the drain electrode. A cleaning treatment may be performed on the gate insulation layer having the preliminary recess structure.

In forming the recess structure according to example embodiments, a preliminary recess structure may be formed on the gate insulation layer by performing a plasma treatment on the gate insulation layer between the source electrode and the drain electrode. The recess structure may be formed on the gate insulation layer by performing a cleaning treatment on the gate insulation layer having the preliminary recess structure. The mask pattern may be removed from the source electrode and the drain electrode.

In forming the electrode layer according to example embodiments, a first electrode film may be formed on the gate insulation layer, and a second electrode film may be formed on the first electrode film by nitriding the first electrode film. Here, the second electrode film and the first electrode film may be partially etched to form a first electrode pattern and a second electrode pattern on a first portion of the gate insulation layer, and to form a third electrode pattern and a fourth electrode pattern on a second portion of the gate insulation layer. Further, the mask pattern may be removed from the source electrode and the drain electrode, and then a plasma treatment and/or a cleaning treatment may be performed on the gate insulation layer between the source electrode and the drain electrode.

According to example embodiments of the present invention, the recess structure may be provided on the gate insulation layer between the source and drain electrodes by performing at least one of the plasma treatment and the cleaning treatment, so that an internal stress generated in forming the source and drain electrodes may be removed from the gate insulation layer. Additionally, a portion of the gate insulation layer damaged by the etching process and etching by-products including metal compounds and/or metallic particles may be effectively removed from the gate insulation layer. Therefore, a channel region of the oxide semiconductor device may be uniformly formed in the active pattern filling the recess structure, on the gate insulation layer, such that the oxide semiconductor device may have enhanced electrical characteristics such as an improved operation current, an increased charge mobility, an decreased threshold voltage variation, etc. Furthermore, the charge mobility and the operation current of the oxide semiconductor device may be further enhanced because the gate insulation layer may have a small thickness reduced by the recess structure. When the oxide semiconductor device is employed in a display device such as an organic light emitting display device, a liquid crystal display device or a flexible display device, the display device may have various advantages, for example, a reduced thickness, an increased operation speed, an enhanced quality of displayed images, etc.

BRIEF DESCRIPTION OF THE DRAWINGS

Example embodiments will be more clearly understood from the following detailed description taken in conjunction with the accompanying drawings.

FIG. 1 is a cross-sectional view illustrating an oxide semiconductor device in accordance with example embodiments of the present invention.

FIG. 2 is a flow chart illustrating a method of manufacturing an oxide semiconductor device in accordance with example embodiments of the present invention.

FIG. 3 is a flow chart illustrating a method of manufacturing an oxide semiconductor device in accordance with some example embodiments of the present invention.

FIGS. 4, 5, 6, 7, and 8 are cross-sectional views illustrating a method of manufacturing an oxide semiconductor device in accordance with some example embodiments of the present invention.

FIG. 9 is a flow chart illustrating a method of manufacturing an oxide semiconductor device in accordance with some example embodiments of the present invention.

FIGS. 10, 11, and 12 are cross-sectional views illustrating a method of manufacturing an oxide semiconductor device in accordance with some example embodiments of the present invention.

FIG. 13 is a flow chart illustrating a method of manufacturing an oxide semiconductor device in accordance with some example embodiments of the present invention.

FIG. 14 is a flow chart illustrating a method of manufacturing an oxide semiconductor device in accordance with some example embodiments of the present invention.

FIG. 15 is a cross-sectional view illustrating an oxide semiconductor device in accordance with some example embodiments.

FIG. 16 is a flow chart illustrating a method of manufacturing an oxide semiconductor device in accordance with some example embodiments of the present invention.

FIGS. 17, 18, 19, and 20 are cross-sectional views illustrating a method of manufacturing an oxide semiconductor device in accordance with some example embodiments of the present invention.

FIG. 21 is a cross-sectional view illustrating an oxide semiconductor device in accordance with some example embodiments of the present invention.

FIGS. 22 and 23 are cross-sectional views illustrating a method of manufacturing an oxide semiconductor device in accordance with some example embodiments of the present invention.

FIG. 24 is a cross-sectional view illustrating a display device including an oxide semiconductor device in accordance with example embodiments of the present invention.

FIGS. 25, 26, 27, and 28 are cross-sectional views illustrating a method of manufacturing a display device including an oxide semiconductor device in accordance with example embodiments of the present invention.

DETAILED DESCRIPTION

Figure 1:
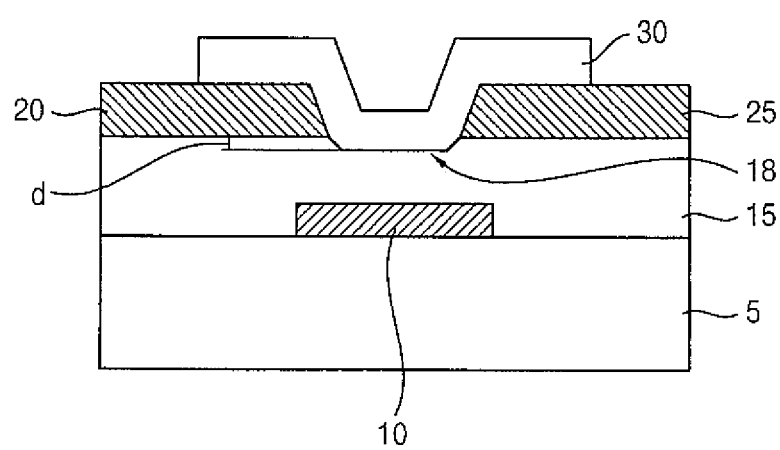
FIGS. 1 to 28 represent non-limiting, example embodiments as described herein.

Various example embodiments will be described more fully hereinafter with reference to the accompanying drawings, in which some example embodiments are shown. The invention may, however, be embodied in many different forms and should not be construed as limited to example embodiments set forth herein. Rather, these example embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
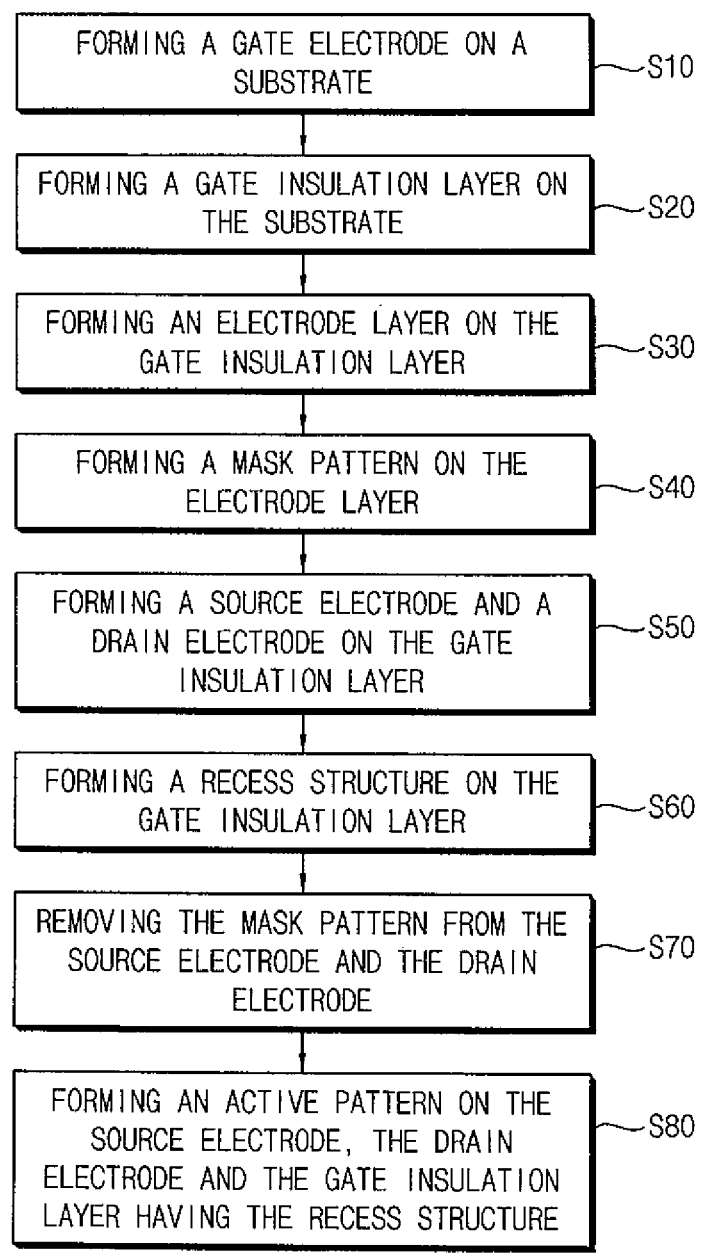

An Oxide Semiconductor Device and a Method of Manufacturing an Oxide Semiconductor Device FIG. 1 is a cross-sectional view illustrating an oxide semiconductor device in accordance with example embodiments of the present invention. FIG. 2 is a flow chart illustrating a method of manufacturing an oxide semiconductor device in accordance with example embodiments of the present invention.

Referring to FIG. 1, the oxide semiconductor device is provided on a substrate 5. The oxide semiconductor device may include a gate electrode 10, a gate insulation layer 15, a source electrode 20, a drain electrode 25 and an active pattern 30.

The substrate 5 may include a transparent insulation substrate. For example, the substrate 5 may include a glass substrate, a quartz substrate, a transparent plastic glass, a transparent metal oxide substrate, etc. In example embodiments, a buffer layer is disposed on the substrate 5. The buffer layer may prevent the diffusion of impurities from the substrate 5 and may improve the flatness (e.g., an entire flatness) of the substrate 5. Although an upper face of the substrate 5 may be relatively uneven, the buffer layer having a substantially level (e.g., even or flat) upper face may be disposed on the substrate 5. Further, when the buffer layer is located on the substrate 5, a stress generated in a formation of the gate electrode 10 may be reduced, so that the gate electrode 10 may be easily provided on the substrate 5. The buffer layer may include a silicon compound. For example, the buffer layer may include silicon oxide ($SiO_x$), silicon nitride ($SiN_x$), silicon oxynitride ($SiO_xN_y$), etc. The buffer layer may have a single layer structure having one silicon compound film, or a multi layer structure having silicon compound films.

Referring to FIGS. 1 and 2, the gate electrode 10 is formed on the substrate 5 in step S10. The gate electrode 10 may be connected to a gate line of a display device in which the oxide semiconductor device is employed. The gate electrode 10 may include a metal, an alloy, a metal nitride, a conductive metal oxide, a transparent conductive material, etc. For example, the gate electrode 15 may include aluminum (Al), an alloy containing aluminum, aluminum nitride ($AlN_x$), silver (Ag), an alloy containing silver, tungsten (W), tungsten nitride ($WN_x$), copper (Cu), an alloy containing copper, nickel (Ni), chrome (Cr), molybdenum (Mo), an alloy containing molybdenum, titanium (Ti), titanium nitride ($TiN_x$), platinum (Pt), tantalum (Ta), neodymium (Nd), scandium (Sc), tantalum nitride ($TaN_x$), strontium ruthenium oxide ($SrRu_xO_y$), zinc oxide ($ZrO_x$), indium tin oxide (ITO), tin oxide ($SnO_x$), indium oxide ($InO_x$), gallium oxide ($GaO_x$), indium zinc oxide (IZO), etc. These may be used alone or in combinations thereof.

In some example embodiments, the gate electrode 10 has a single layer structure including a metal film, an alloy film, a metal nitride film, a metal oxide film or a transparent conductive material film. Alternatively, the gate electrode 10 may have a multi layer structure that includes a metal film, an alloy film, a metal nitride film, a conductive metal oxide film and/or a transparent conductive material film. When the gate electrode 10 includes the transparent conductive material, the oxide semiconductor device may be employed in a flexible display device because substantially all of elements in the oxide semiconductor device may include transparent materials, respectively.

Generally, a gate electrode of a transistor used in a conventional display device includes a metal having a relatively low resistance, for example, aluminum, silver, copper, etc. However, such a metal may have a relatively low thermal resistance, a relatively low corrosion resistance, etc. Considering these properties, the gate electrode 10 according to example embodiments may include combinations of a first metal having a relatively high electrical conductivity, and a second metal having a relatively high thermal resistance. In example embodiments, the gate electrode 10 may have a multi layer structure that includes a first metal film having a relatively low resistance, a second metal film having a relatively high thermal resistance and/or a metal compound film having a relatively high thermal resistance. In some embodiments, the first metal film may include aluminum, silver, copper, etc. The second metal film may include molybdenum (Mo), titanium (Ti), chrome (Cr), tantalum (Ta), ruthenium (Ru), tungsten (W), neodymium (Nd), scandium (Sc), etc. Additionally, the metal compound layer may include nitrides containing molybdenum, titanium, chrome, tantalum, tungsten, neodymium, scandium, etc. For example, the gate electrode 10 may have a multi layer structure that includes combinations of various films such as an aluminum film and a molybdenum film, a silver film and a molybdenum film, a copper film and a molybdenum film, a copper film and a titanium nitride film, a copper film and a tantalum nitride film, a titanium nitride film and a molybdenum film, and the like.

In some example embodiments, the gate electrode 10 may have a multi layer structure that includes a first metal film containing at least one first metal having a relatively high electrical conductivity, a second metal film including at least one second metal having a relatively high thermal resistance and/or a metal compound film including at least one metal compound having a relatively high thermal resistance.

As illustrated in FIGS. 1 and 2, the gate insulation layer 15 is formed on the substrate 5 to cover the gate electrode 10 in step S20. In example embodiments, the gate insulation layer 15 may have a substantially level upper face without a stepped portion adjacent to an upper portion of the gate electrode 10 while the gate insulation layer 15 may sufficiently cover the gate electrode 10. Here, the gate insulation layer 15 may have a relatively large thickness. For example, the gate insulation layer 15 may have a thickness of about 500 Å to about 3,000 Å as measured from an upper face of the substrate 5.

The gate insulation layer 15 may include a silicon compound, a metal oxide, etc. For example, the gate insulation layer 15 may include silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), titanium oxide ($TiO_x$), etc. These may be used alone or in combinations thereof. The gate insulation layer 15 may include a single layer structure including a silicon compound film or a metal oxide film. Alternatively, the gate insulation layer 15 may have a multi layer structure including at least one silicon compound film and/or at least one metal oxide film.

The source electrode 20 and the drain electrode 25 is disposed on a first portion and a second portion of the gate insulation layer 15 substantially centered around the underlying gate electrode 10. When the gate insulation layer 15 has a level upper face, the source electrode 20 and the drain electrode 25 may also have substantially level upper faces without any stepped portions. The source electrode 20 may be connected to a data line of the display device, and the drain electrode 25 may be electrically connected to a pixel electrode of the display device.

In forming the source electrode 20 and the drain electrode 25 according to example embodiments, as illustrated in FIG. 2, an electrode layer is formed on the gate insulation layer 15 in step S30, and then a mask pattern is formed on the electrode layer in step S40. The mask pattern may include a material that is more resistant to etching relative to the electrode layer. The electrode layer is patterned using the mask pattern as an etching mask, so that the source electrode 20 and the drain electrode 25 is formed on the gate insulation layer 15 in step S50.

Each of the source electrode 20 and the drain electrode 25 may include a metal, an alloy, a metal nitride, a conductive metal oxide, a transparent conductive material, etc. For example, the source electrode 20 and the drain electrode 25 may include aluminum, copper, molybdenum, titanium, chrome, tantalum, tungsten, neodymium, scandium, alloys of these metals, nitrides of these metals, strontium ruthenium oxide, indium tin oxide, indium zinc oxide, zinc oxide, tin oxide, carbon nanotubes, etc. These may be used alone or in a combination thereof. Additionally, each of the source electrode 20 and the drain electrode 25 may have a single layer structure including a metal film, an alloy film, a metal nitride film, a conductive metal oxide film or a transparent conductive material film. Alternatively, each of the source electrode 20 and the drain electrode 25 may have a multi layer structure including a metal film, an alloy film, a metal nitride film, a conductive metal oxide film and/or a transparent conductive material film.

In example embodiments, the oxide semiconductor device may have improved electrical characteristics when the source electrode 20 and the drain electrode 25 are formed using conductive materials having a low electrical resistance such as aluminum, copper, silver, etc. However, the conductive material of a low resistance may have a relatively low thermal resistance or a relatively low corrosion resistance. Thus, in some embodiments, the source and drain electrodes 20 and 25 may be formed using materials having relatively high thermal resistances (or thermally resistive materials) besides the conductive materials. Examples of materials having a relatively high thermal resistance for the source and drain electrodes 20 and 25 include molybdenum, titanium, chrome, tantalum, tungsten, neodymium, ruthenium, scandium, etc. These may be used alone or in combinations thereof. Each of the source and drain electrodes 20 and 25 may have a multi layer structure. For example, each of the source and drain electrodes 20 and 25 may have a multi layer structure that includes a first conductive film containing a material having a thermally resistive material, a second conductive film containing a material having a low electrical resistance, and a third conductive film containing a thermally resistive material. When the source and drain electrodes 20 and 25 have multi layer structures, the source and drain electrodes 20 and 25 may have relatively low electrical resistances due to the conductive materials, and also Hillock phenomena of the source and drain electrodes 20 and 25 may be prevented in accordance with existences of the thermally resistive materials.

Referring now to FIGS. 1 and 2, a recess structure 18 (or a recess) is formed on the gate insulation layer 15 in step S60. After forming the recess structure 18 on the gate insulation layer 15, the mask pattern is removed from the source and drain electrodes 20 and 25 in step S70. For example, when the mask pattern includes a photoresist, the mask pattern may be removed by a stripping process and/or an ashing process.

In example embodiments, the recess structure 18 may have a depth (d) (e.g., a predetermined depth) from an upper face of the gate insulation layer 15. For example, the recess structure 18 may have a depth (d) of about 100 Å to about 300 Å from the upper face of the gate insulation layer 15. Thus, a ratio between the depth (d) of the recess structure 18 and the thickness of the gate insulation layer 15 may be in a range from about 1.0:1.7 to about 1.0:30.0. Further, the recess structure 18 may have a size (e.g., a width in a direction parallel to the substrate 5) substantially smaller than that of the gate electrode 10. However, the recess structure 18 may have dimensions which vary in accordance with a size and electrical characteristics of the oxide semiconductor device.

As for the oxide semiconductor device illustrated in FIG. 1, the recess structure 18 is entirely formed at an exposed portion of the gate insulation layer 15 between the source electrode 20 and the drain electrode 25. However, the recess structure 18 may also be formed in a portion of the exposed portion of the gate insulation layer 15 between the source and drain electrodes 20 and 25. That is, the recess structure 18 may have a width substantially the same as or substantially smaller than a width of the exposed portion of the gate insulation layer 15. The recess structure 18 of the gate insulation layer 15 may have various planar shapes, for example, a substantially circular shape, a substantially elliptical shape, a substantially polygonal shape, etc. The recess structure 18 may include an inclined sidewall having a relatively small first angle of inclination with respect to an axis or a line substantially perpendicular to the substrate 5. For example, the recess structure 18 may have a sidewall inclined by a first angle of inclination in a range from about 10° to about 60° relative to a direction substantially perpendicular to the substrate 5. A lower portion of the active pattern 30 is positioned in the recess structure 18 of the gate insulation layer 15. Namely, the active pattern 30 is located on the gate insulation layer 15 to fill the recess structure 18. Hence, the active pattern 30 is partially buried in the gate insulation layer 15.

In example embodiments, the recess structure (or recess) 18 may be formed by performing a plasma treatment on the gate insulation layer 15 exposed between the source electrode 20 and the drain electrode 25. Here, the gate insulation layer 15 may have residual internal stress and/or etching by-products remaining thereon. Further, the gate insulation layer 15 may have a damaged portion formed during an etching process for forming the source and drain electrodes 20 and 25. The recess structure 18 may be formed by plasma treatment, which may remove the damaged portion of the gate insulation layer 15, the etching by-products remaining on the gate insulation layer 15 and/or the residual internal stress generated in the gate insulation layer 15. For example, the plasma treatment may be executed using a plasma generated from a gas such as a gas including sulfur fluoride ($SF_x$), a gas including chlorine fluoride ($ClF_x$), a gas including hydrogen chloride (HCl), a gas including boron chloride ($BCl_x$), a gas including hydrocarbon ($C_xH_y$), a gas including oxygen ($O_2$), a gas including ozone ($O_3$), etc. These may be used alone or in combinations thereof.

In some example embodiments, the recess structure 18 is obtained by a cleaning treatment in which the gate insulation layer exposed between the source electrode 20 and the drain electrode 25 is partially removed. The cleaning treatment may be performed using a mixture including a solution for removing a metal compound and a pure water or a deionized water. In other words, the cleaning treatment may be carried out using a diluted solution for removing a metal compound. For example, the cleaning treatment may be executed using a solution such as a solution including hydrogen fluoride (HF), a solution including hydrogen chloride (HCl), a solution including phosphoric acid ($H_3PO_4$), a solution including potassium hydroxide (KOH), a solution including hydrogen bromide (HBr), a solution including iodine bromide (IBr), etc. These may be used alone or in combinations thereof.

In some example embodiments, the recess structure 18 of the gate insulation layer 15 may be obtained by performing both the above-described plasma treatment and the above-described cleaning treatment. For example, the recess structure 18 may be formed by sequentially performing the plasma treatment and the cleaning treatment on the exposed portion of the gate insulation layer 15. Alternatively, the recess structure 18 may be obtained by performing the plasma treatment on the exposed portion of the gate insulation layer 15 and by executing the cleaning treatment on the exposed portion of the gate insulation layer 15 after removing the mask pattern from the source and drain electrodes 20 and 25.

As illustrated in FIGS. 1 and 2, the active pattern 30 is formed on the gate insulation layer 15 having the recess structure 18, the source electrode 20 and the drain electrode 25 in step S80. A lower sidewall of the active pattern 30 may have an inclined angle substantially the same as or substantially similar to that of the sidewall of the recess structure 18 because the active pattern 30 may be formed on the gate insulation layer 15 to fill the recess structure 18. That is, a lower portion of the active pattern 30 may have a relatively small first angle of inclination with respect to an axis, a line or a direction substantially perpendicular to the substrate 5.

As described above, when the gate insulation layer 15 includes the recess structure 18, a thickness of a portion of the gate insulation layer 15 between the source electrode 20 and the drain electrode 25 may be relatively smaller than thicknesses of other portions of the gate insulation layer 15 beneath the source and drain electrodes 20 and 25. Namely, the thickness of the gate insulation layer 15 on the gate electrode 10 may be reduced by the depth (d) of the recess structure 18. Because a channel region of the oxide semiconductor device may be formed in the active pattern 30 filling the recess structure 18, the oxide semiconductor device may exhibit improved electrical characteristics, for example, an increased charge mobility, an increased operation current, etc., when the gate insulation layer 15 has a relatively small thickness beneath the channel region formed in the active pattern 30.

In example embodiments of the present invention, each of the source electrode 20 and the drain electrode 25 has a sidewall inclined by a relatively large second angle of inclination with respect to the gate insulation layer 15. For example, each of the source electrode 20 and the drain electrode 25 may include an inclined sidewall by a second angle of inclination in a range from about 30° to about 90° relative to an axis, a line or a direction substantially perpendicular to the substrate 5. Thus, a ratio between the first angle of inclination of the recess structure 18 and the second angle of inclination of the source and drain electrodes 20 and 25 may be in a range from about 1.0:0.5 to about 1.0:9.0. When each of the recess structure 18, the source electrode 20 and the drain electrode 25 have the inclined sidewalls as described above, the active pattern 30 may be easily formed on the gate insulation layer 15 along profiles of the recess structure 18, the source electrode 20 and the drain electrode 25.

According to example embodiments of the present invention, the active pattern 30 is disposed on the source electrode 20 and the drain electrode 25 to fill the recess structure 18 of the gate insulation layer 15. Therefore, a whole sidewall of the active pattern 30 may include portions having different angles of inclination. In this case, the lower sidewall of the active pattern 30 contacting the gate insulation layer 15 may have the relatively small first angle of inclination with respect to the axis, the line or the direction substantially perpendicular to the substrate 5. Further, a central sidewall of the active pattern 30 contacting the source electrode 20 and the drain electrode 25 may have the relatively large second angle of inclination with respect to the axis, the line or the direction substantially perpendicular to the substrate 5. That is, the central sidewall of the active pattern 30 may have an inclined sidewall substantially the same as or substantially similar to those of the source electrode 20 and the drain electrode 25. Therefore, a ratio of the inclined angles between the lower sidewall of the active pattern 30 and the central sidewall of the active pattern 30 may be in a range from about 1.0:0.5 to about 1.0:9.0.

A first portion of the active pattern 30 may extend on the source electrode 20, and a second portion of the active pattern 30 may extend on the drain electrode 25. Thus, a central portion of the active pattern 30 may substantially overlap with the gate electrode 10 on the gate insulation layer 15. That is, the first and the second portions of the active pattern 30 may partially overlap with the gate electrode 10. Because the active pattern 30 may be positioned on the source electrode 20, the drain electrode 25 and the gate insulation layer 15, the active pattern 30 may have stepped portions adjacent to the first and the second portions of the active pattern 30. For example, the active pattern 30 may have a substantially "U" shaped cross section including the stepped portions adjacent to both of end portions thereof.

In example embodiments of the present invention, the active pattern 30 may include a semiconductor oxide. Examples of the semiconductor oxide include a binary compound ($AB_x$), a ternary compound ($AB_xC_y$) or a quaternary compound ($AB_xC_yD_z$), which may contain indium (In), zinc (Zn), gallium (Ga), tin (Sn), titanium (Ti), aluminum (Al), hafnium (Hf), zirconium (Zr), magnesium (Mg), etc. Here, a carrier concentration of the active pattern 30 may be in a range from about $1 \times 10^{12}$ atoms/cm$^3$ to about $1 \times 10^{18}$ atoms/cm$^3$. For example, the active pattern 30 may include indium-gallium-zinc oxide (IGZO), gallium zinc oxide ($GaZn_xO_y$), indium tin oxide (ITO), indium zinc oxide (IZO), zinc magnesium oxide ($ZnMg_xO_y$), zinc tin oxide ($ZnSn_xO_y$), zinc zirconium oxide ($ZnZr_xO_y$), zinc oxide ($ZnO_x$), gallium oxide ($GaO_x$), titanium oxide ($TiO_x$), tin oxide ($SnO_x$), indium oxide ($InO_x$), indium-gallium-hafnium oxide (IGHO), tin-aluminum-zinc oxide (TAZO), indium-gallium-tin oxide (IGSO), etc. These may be used alone or in a combination thereof. In some example embodiments, the active pattern 30 may include the semiconductor oxide doped with additional elements such as lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), ruthenium (Ru), germanium (Ge), tin (Sn), fluorine (F), etc. These may be added alone or in combinations thereof. Further, the active pattern 30 may have a single layer structure including a semiconductor oxide film or a multi layer structure including semiconductor oxide films.

In some example embodiments of the present invention, at least one additional layer such as an etching stop layer, a protection layer and the like is disposed between the gate insulation layer 15 and the source and drain electrodes 20 and 25. Such an additional layer may protect the gate insulation layer 15 during manufacturing processes for the oxide semiconductor device. Here, the etching stop layer or the protection layer may include a material having an etching selectivity relative to the source and drain electrodes 20 and 25 and the gate insulation layer 15. For example, the etching stop layer or the protection layer may include silicon oxide, silicon nitride, silicon oxynitride, semiconductor oxide, etc.

According to example embodiments of the present invention, the oxide semiconductor device having the recess structure 18 is illustratively described. However, a recess structure according to example embodiments may be employed in other transistors including an active pattern (layer) containing amorphous silicon, polysilicon, partially crystallized silicon, silicon containing micro crystals, etc. Here, the transistors may have a construction substantially the same as or substantially similar to that of the oxide semiconductor device described above with reference to FIG. 1 except for the material in the active pattern (layer).

According to example embodiments of the present invention, the recess structure 18 may be obtained by performing the plasma treatment and/or the cleaning treatment on the gate insulation layer 15 between the source electrode 20 and the drain electrode 25, so that an internal stress and/or a residual stress may be reduced or removed from the gate insulation layer 15. The internal stress may be generated in the gate insulation layer 15 while forming the source and drain electrodes 20 and 25, and the residual stress may be caused by etching damage of the gate insulation layer 15. Further, etching by-products may be completely removed from the gate insulation layer 15 while forming the recess structure 18. The etching by-products including metallic particles and/or metal compounds may be left behind between the gate insulation layer 15 and the active pattern 30 while forming the source and drain electrodes 20 and 25. Therefore, a channel region of the oxide semiconductor device formed in the active pattern 30 filling the recess structure 18 may be made substantially uniform and substantially level and prevent or reduce the risk of deterioration of electrical characteristics of the oxide semiconductor device such as a reduced operation current, an increased variation of threshold voltages, a reduced charge mobility in the channel region, etc. Additionally, the gate insulation layer 15 on the gate electrode 10 may have a relatively thin thickness because of the recess structure 18, such that the electrical characteristics of the oxide semiconductor for example, the increased charge mobility, the increased operation current, etc. may be enhanced.

Figure 3:
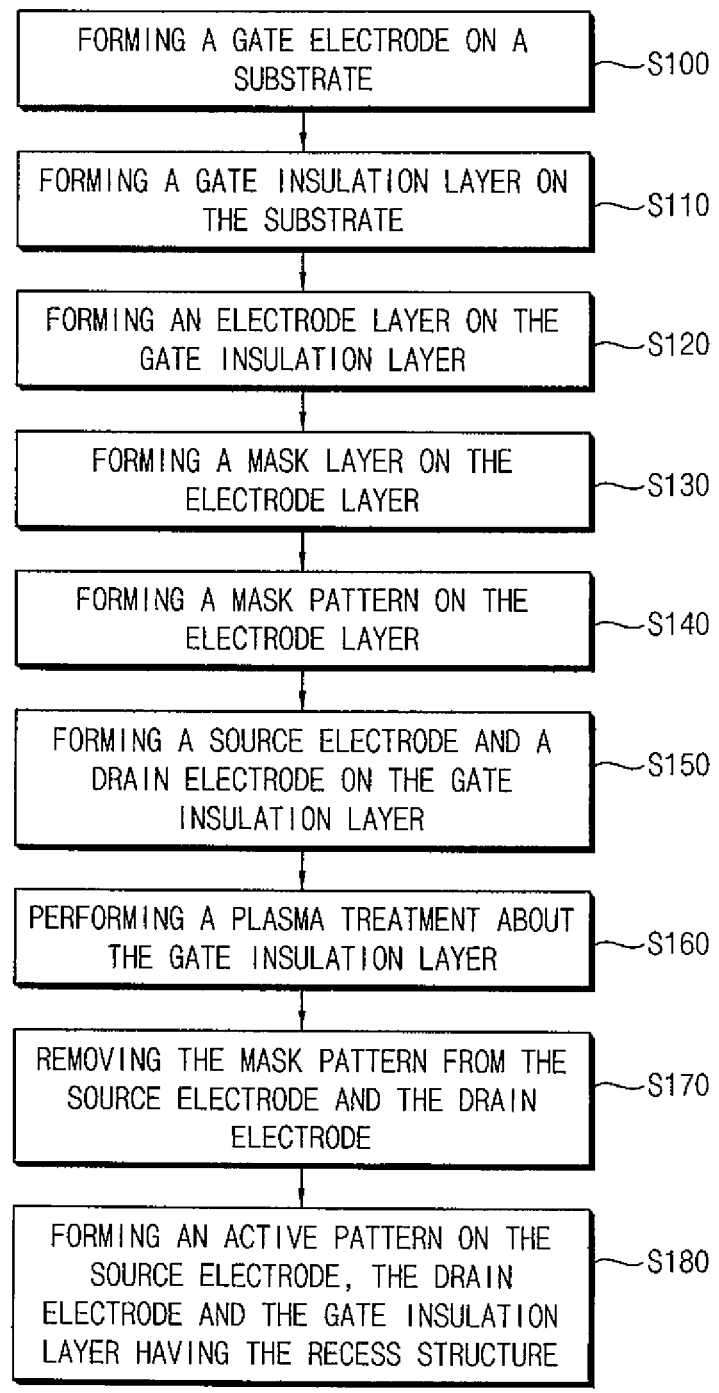

FIG. 3 is a flow chart illustrating a method of manufacturing an oxide semiconductor device in accordance with some example embodiments of the present invention. FIGS. 4 to 8 are cross-sectional views illustrating a method of manufacturing an oxide semiconductor device in accordance with some example embodiments of the present invention. In FIGS. 3 to 8, the method provides an oxide semiconductor device having a construction substantially the same as or substantially similar to that of the oxide semiconductor device described with reference to FIG. 1, however, the method illustrated in FIGS. 3 to 8 may be employed in manufacturing other oxide semiconductor devices having various constructions including gate electrodes, gate insulation layers, active patterns, source electrodes, drain electrodes, etc.

Figure 4:
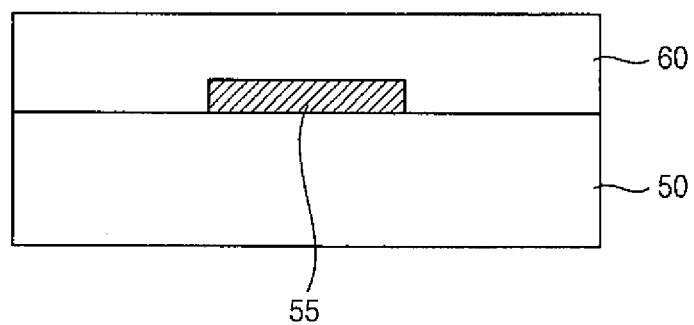

Referring to FIGS. 3 and 4, in step S100, a gate electrode 55 is formed on a substrate 50 including a transparent insulation material such as glass, quartz, transparent plastic, transparent ceramic, etc. The gate electrode 55 may be formed by a sputtering process, a spray process, a chemical vapor deposition (CVD) process, an atomic layer deposition (ALD) process, a vacuum evaporation process, a printing process, etc. In example embodiments of the present invention, the gate electrode 55 may be formed on the substrate 50 by patterning a first conductive layer after forming the first conductive layer on the substrate 50. In this case, a gate line may be formed on the substrate 50 while forming the gate electrode 55. For example, the gate line may extend on the substrate 50 along a first direction, and the gate electrode 55 may extend from the gate line along a direction substantially perpendicular to the first direction.

The gate electrode 55 may be formed using aluminum, tungsten, copper, nickel, chrome, molybdenum, titanium, platinum, tantalum, ruthenium, alloys containing these metals, nitrides containing these metals, a conductive metal oxide, etc. These may be used alone or in a combination thereof. Further, the gate electrode 55 may have a single layer structure or a multi layer structure. For example, the gate electrode 55 may have a single layer structure or a multi layer structure, which includes an electrically conductive material and/or a thermally resistive material. In some example embodiments, the gate electrode 55 may be obtained by patterning a transparent conductive material layer after forming the transparent conductive material layer on the substrate 50. The transparent conductive material film for the gate electrode 55 may be formed using indium tin oxide (ITO), indium zinc oxide (IZO), zinc oxide, tin oxide, gallium oxide, indium oxide, etc. These may be used alone or in combinations thereof.

In some example embodiments, a buffer layer is formed on the substrate 50, and then the gate electrode 55 is formed on the buffer layer. Here, the buffer layer on the substrate 50 may have a single layer structure or a multi layer structure, which may include silicon oxide, silicon nitride and/or silicon oxynitride. The buffer layer may mitigate or prevent a diffusion of impurities from the substrate 50 while forming the gate electrode 55 and may improve a flatness of the substrate 50. Additionally, the buffer layer may reduce a stress generated between the substrate 50 and the gate electrode 55.

As illustrated in FIGS. 3 and 4, a gate insulation layer 60 is formed on the substrate 50 to cover the gate electrode 55 in step S110. The gate insulation layer 60 may be obtained by a chemical vapor deposition process, a thermal oxidation process, a plasma enhanced chemical vapor deposition (PECVD) process, a high density plasma-chemical vapor deposition (HDP-CVD) process, a spin coating process, etc. Additionally, the gate insulation layer 60 may be formed using a silicon compound, a metal oxide, etc. For example, the gate insulation layer 60 may be obtained using silicon oxide, silicon oxynitride, hafnium oxide, zirconium oxide, aluminum oxide, tantalum oxide, etc. These may be used alone or in combinations thereof.

In example embodiments of the present invention, the gate insulation layer 60 may have a relatively large thickness in consideration of a transmittance of light incident into the oxide semiconductor device. Further, the gate insulation layer 60 may have a substantially level upper face while sufficiently covering the gate electrode 55. In this case, an upper portion of the gate insulation layer 60 may be planarized by a planarization process such as a chemical mechanical polishing (CMP) process and/or an etch-back process.

Figure 5:
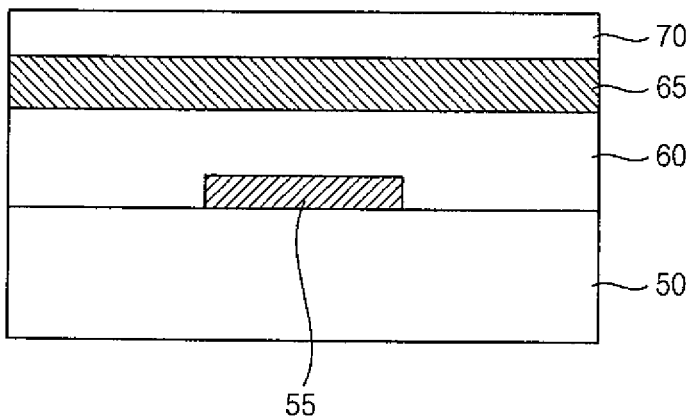

Referring to FIGS. 3 and 5, an electrode layer 65 is formed on the gate insulation layer 60 in step S120. The electrode layer 65 may be formed on the gate insulation layer 60 using a metal, an alloy, a metal nitride, a conductive metal oxide, and/or a transparent conductive material by a sputtering process, a printing process, a vacuum evaporation process, a chemical vapor deposition process, an atomic layer deposition process, etc. For example, the electrode layer 65 may be formed of aluminum, copper, molybdenum, titanium, chrome, tantalum, tungsten, neodymium, scandium, alloys containing these metals, nitrides containing these metals, indium tin oxide, indium zinc oxide, zinc oxide, tin oxide, carbon nanotubes, etc. These may be used alone or in combinations thereof. The electrode layer 65 may have a single layer structure or a multi layer structure including a metal film, an alloy film, a metal nitride film, a conductive metal oxide film and/or a transparent conductive material film.

In some example embodiments of the present invention, an etch stop layer and/or a protection layer is formed between the gate insulation layer 60 and the electrode layer 65. For example, the etch stop layer and/or the protection layer may be formed using oxide, nitride, oxynitride, semiconductor oxide, etc. These may be used alone or in combinations thereof. The etch stop layer and/or the protection layer may protect underlying structures including the gate electrode 55 and the gate insulation layer 60 while etching the electrode layer 65.

A mask layer 70 is formed on the electrode layer 65 in step S130. In example embodiments, the mask layer 70 is formed by coating photoresist onto the electrode layer 65 through a spin coating process. In some example embodiments, the mask layer 70 is formed using a material having a relatively high etching selectivity with respect to the electrode layer 65. For example, the mask layer 70 may be formed using silicon oxide, silicon nitride, silicon oxynitride, etc. These may be used alone or in combinations thereof. In this case, the mask layer 70 may be formed by a chemical vapor deposition process, an atomic layer deposition process, a plasma enhanced chemical vapor deposition process, a high density plasma-chemical vapor deposition process, etc. Further, the mask layer 70 may have a single layer structure or a multi layer structure including an oxide film, a nitride film and/or an oxynitride film.

Figure 6:
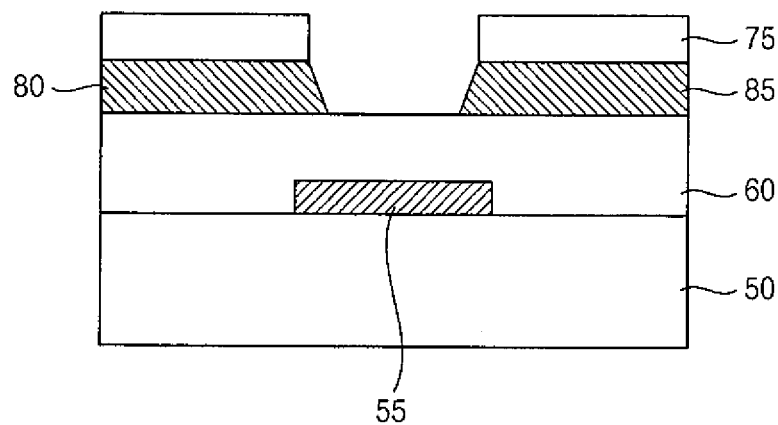

Referring to FIGS. 3 and 6, in step S140, a mask pattern 75 is formed on the electrode layer 65 by partially etching the mask layer 70. The mask pattern 75 may expose a portion of the electrode layer 65 under which the gate electrode 55 is positioned. When the mask layer 70 includes photoresist, the mask pattern 75 may be formed by an exposure process and a developing process. When the mask layer 70 includes oxide, nitride and/or oxynitride, the mask pattern 75 may be formed on the electrode layer 65 by a photolithography process. In example embodiments of the present invention, an area of a portion of the electrode layer 65 exposed by the mask pattern 75 may be substantially smaller than an area of the gate electrode 55.

The electrode layer 65 may be partially etched using the mask pattern 75 as an etching mask, so that a source electrode 80 and a drain electrode 85 may be formed on the gate insulation layer 60 in step S150. In example embodiments of the present invention, each of the source electrode 80 and the drain electrode 85 may have a sidewall inclined by a relatively large angle of inclination with respect to the substrate 50. For example, each of the source electrode 80 and the drain electrode 85 may include an inclined sidewall with a relatively large angle of inclination in a range from about 30° to about 90° with respect to the substrate 50. When the source and drain electrodes 80 and 85 are formed on the gate insulation layer 60, a portion of the gate insulation layer 60 under which the gate electrode 55 is located may be exposed. An area of a portion of the gate insulation layer 60 exposed between the source and drain electrodes 80 and 85 may be substantially smaller than an area of the gate electrode 55. The source electrode 80 and the drain electrode 85 may be spaced apart each other on the gate insulation layer 60 by a distance (e.g., a predetermined distance). In this case, end portions of the source and drain electrodes 80 and 85 may be partially overlap with end portions of the gate electrode 55, respectively.

Figure 7:
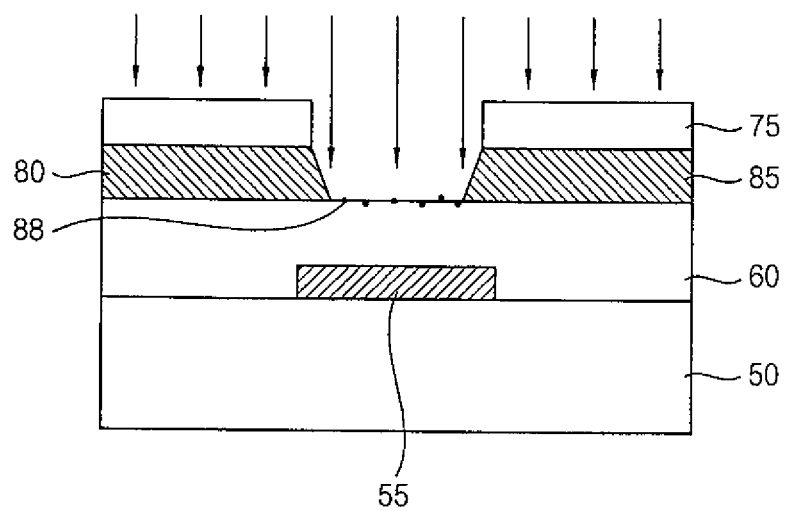

Referring to FIGS. 3 and 7, the portion of the gate insulation layer 60 exposed between the source and drain electrodes 80 and 85 may be damaged during an etching process for patterning the electrode layer 65 to form the source and drain electrodes 80 and 85. Further, the gate insulation layer 60 may have a residual stress and/or etching by-products 88 remaining thereon after the etching process. Such etching by-products 88 may include metal compounds or metallic particles generated from reactions between metal atoms and ingredients in an etching solution or an etching gas.

Figure 8:
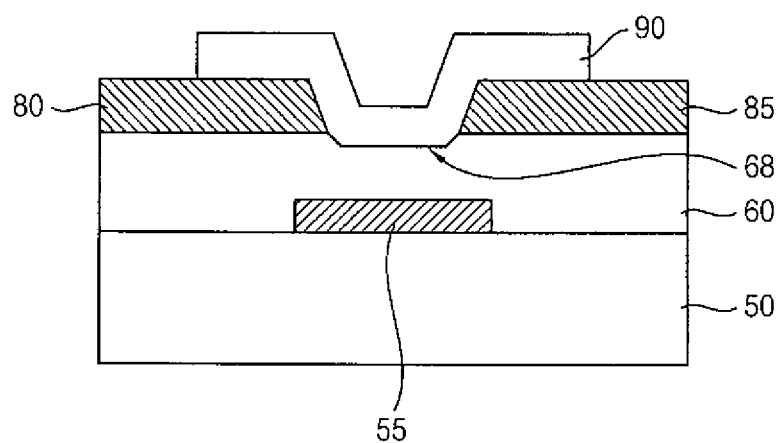

In step S160, a plasma treatment is performed on the portion of the gate insulation layer 60 exposed between the source and drain electrodes 80 and 85 as indicated by arrows in FIG. 7. A recess structure 68 may be formed on the gate insulation layer 60 by partially removing the gate insulation layer 60 during the plasma treatment as illustrated in FIG. 8. That is, the plasma treatment may remove a portion of the gate insulation layer 60 having the etched damage, the internal stress, the residual stress and/or the etching by-products 88 remaining on a surface of the gate insulation layer 60. The recess structure 68 may have a depth of, for example, about 100 Å to about 300 Å based on (e.g., as measured from) the upper face of the gate insulation layer 65. Further, the recess structure 68 may have a sidewall inclined by a relatively small angle of inclination in a range from about 10° to about 60° relative to a direction substantially perpendicular to the substrate 50. In example embodiments, the plasma treatment may be executed using a plasma generated from a gas such as a gas including sulfur fluoride ($SF_x$), a gas including chlorine fluoride ($ClF_x$), a gas including hydrogen chloride (HCl), a gas including boron chloride ($BCl_x$), a gas including hydrocarbon ($C_xH_y$), a gas including oxygen ($O_2$), a gas including ozone ($O_3$), etc. These may be used alone or in combinations thereof. For example, the plasma treatment may be carried out using a plasma generated from a mixture of a first gas including sulfur fluoride and a second gas including oxygen.

After performing the above-described plasma treatment on the gate insulation layer 60, the mask pattern 75 is removed from the source and drain electrodes 80 and 85 in step S170. When the mask pattern 75 includes photoresist, the mask pattern 75 may be removed by a stripping process and/or an ashing process. On the other hand, when the mask pattern 75 includes oxide, nitride and/or oxynitride, the mask pattern 75 may be removed by using an etching solution phosphoric acid or hydrogen fluoride, or an etching gas including phosphoric acid or hydrogen fluoride.

Referring to FIGS. 3 and 8, an active layer may be formed on the source electrode 80, the drain electrode 85 and the gate insulation layer 60 having the recess structure 68. In example embodiments, the active layer may be formed using a semiconductor oxide. Examples of the semiconductor oxide may include a binary compound ($AB_x$), a ternary compound ($AB_xC_y$) or a quaternary compound ($AB_xC_yD_z$), which may contain indium (In), zinc (Zn), gallium (Ga), tin (Sn), titanium (Ti), etc. In some example embodiments, the active layer may be formed using the semiconductor oxide doped with additional elements such as lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), ruthenium (Ru), germanium (Ge), tin (Sn), fluorine (F), etc. These may be added alone or in combinations thereof. In some example embodiments of the present invention, the active layer includes amorphous silicon, polysilicon, partially crystallized silicon, silicon containing micro crystals, etc. Further, the active layer may be formed by a sputtering process, a spray process, a chemical vapor deposition (CVD) process, an atomic layer deposition (ALD) process, a vacuum evaporation process, a printing process, a sol-gel process, a plasma enhanced chemical vapor deposition (PECVD) process, etc. For example, a carrier concentration of the active layer may be in a range from about $1\times10^{12}$ atoms/cm$^3$ to about $1\times10^{18}$ atoms/cm$^3$.

An active pattern 90 is formed on the gate insulation layer 60, the source electrode 80 and the drain electrode 85 by partially etching the active layer in step S180. Hence, an oxide semiconductor device including the gate electrode 55, the gate insulation layer 60 having the recess structure 68, the source electrode 80, the drain electrode 85 and the active pattern 90 may be provided on the substrate 50. For example, the active pattern 90 may be obtained by a photolithography process or an etching process using an additional etching mask.

In example embodiments of the present invention, a sidewall of the active pattern 90 may have inclined angles substantially the same as or substantially similar to that of a sidewall of the recess structure 68 because the active pattern 90 may be disposed on the source and drain electrodes 80 and 85 to fill the recess structure 68. In this case, a lower sidewall of the active pattern 90 contacting the gate insulation layer 60 may have a relatively small inclined angle, whereas a central sidewall of the active pattern 90 contacting the source electrode 80 and the drain electrode 85 may have a relatively large inclined angle. Namely, a whole sidewall of the active pattern 90 may include portions having more than two different inclined angles. Additionally, the active pattern 90 may have stepped portions adjacent to the source and drain electrodes 80 and 85 because the active pattern 90 may be formed along profiles of the source electrode 80, the drain electrode 85 and the gate insulation layer 60 having the recess structure 68. Here, a first portion of the active pattern 90 may extend on the source electrode 80, and a second portion of the active pattern 90 may extend on the drain electrode 85. Thus, an upper portion of the active pattern 90 may have an area substantially larger than that of the gate electrode 55, while a lower portion of the active pattern 90 may have an area substantially smaller than that of the gate electrode 55.

Figure 9:
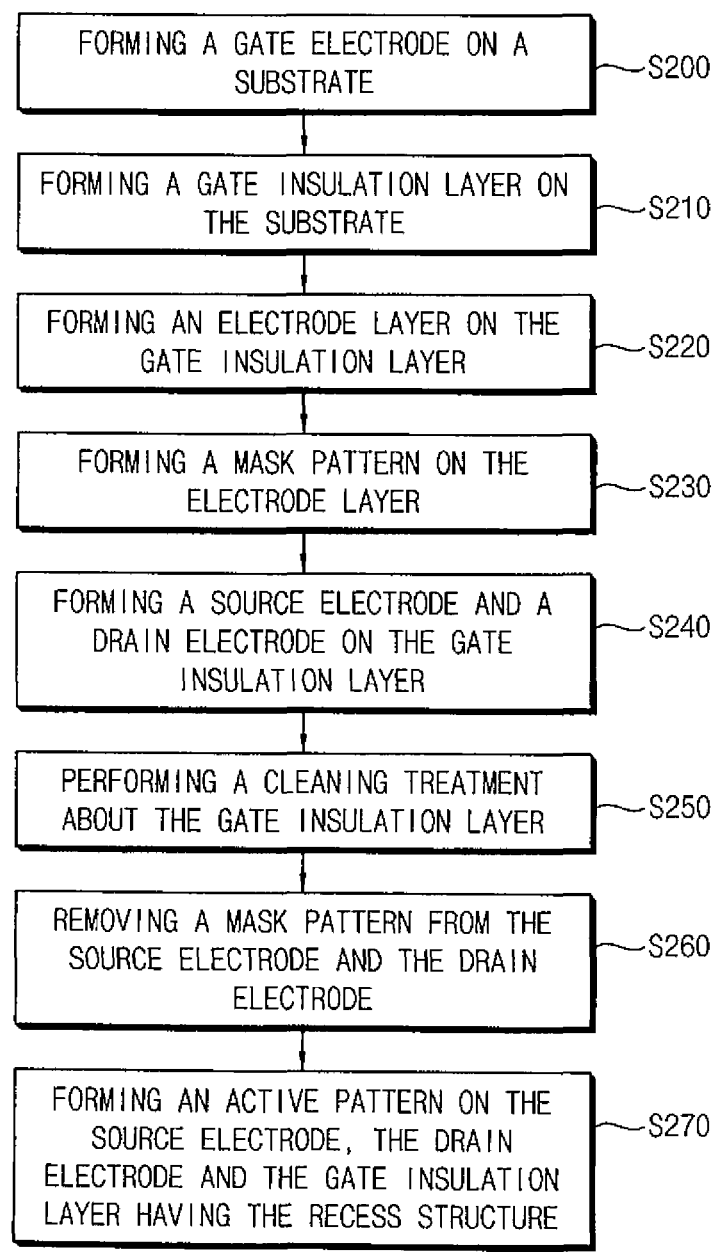
Figure 10:
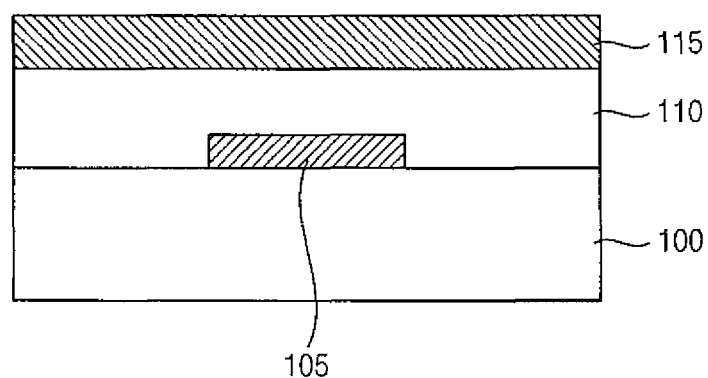
Figure 11:
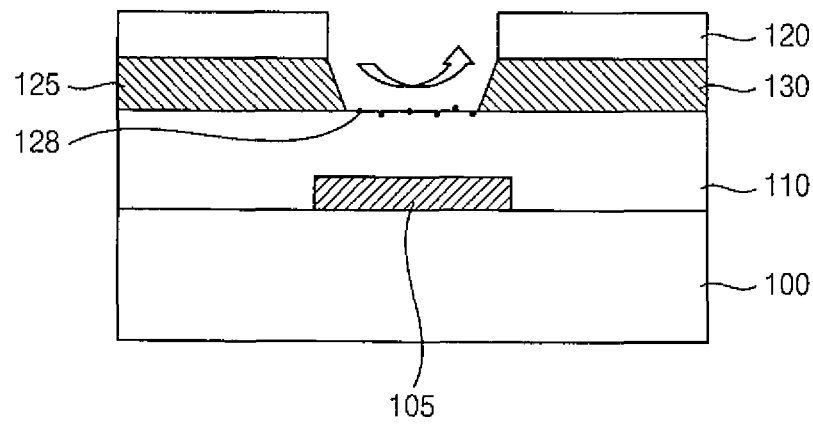
Figure 12:
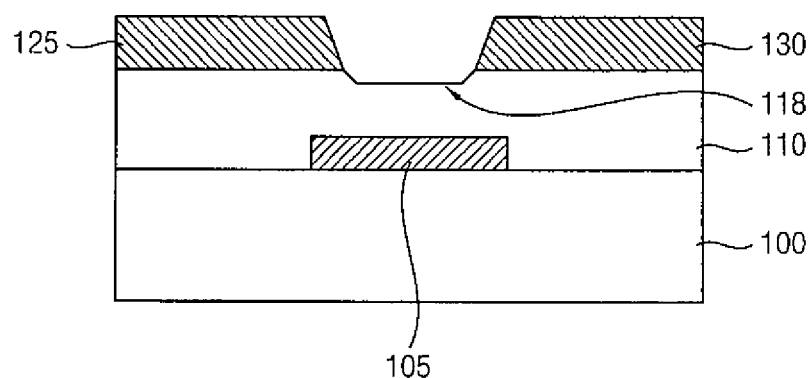

FIG. 9 is a flow chart illustrating a method of manufacturing an oxide semiconductor device in accordance with some example embodiments of the present invention. FIGS. 10 to 12 are cross-sectional views illustrating a method of manufacturing an oxide semiconductor device in accordance with some example embodiments of the present invention. In FIGS. 9 to 12, the method may provide an oxide semiconductor device having a construction substantially the same as or substantially similar to that of the oxide semiconductor device described with reference to FIG. 1, however, the method illustrated in FIGS. 9 to 12 may be employed in manufacturing other oxide semiconductor devices having various constructions including gate electrodes, gate insulation layers, active patterns, source electrodes, drain electrodes, etc.

Referring to FIGS. 9 and 10, a gate electrode 105 is formed on a substrate 100 including a transparent insulation material in step S200, and then a gate insulation layer 110 is formed on the substrate 100 to cover the gate electrode 105 in step S210.

The gate electrode 105 may be formed using a metal, an alloy, a conductive metal oxide, a transparent conductive material, etc. The gate insulation layer 110 may be formed using a silicon compound, a metal oxide, etc. The gate insulation layer 110 may have a substantially level upper face while sufficiently covering the gate electrode 105. In this case, a planarization process may be additionally performed on an upper portion of the gate insulation layer 110.

An electrode layer 115 is formed on the gate insulation layer 110 in step S220. The electrode layer 115 may include a metal, an alloy, a metal nitride, a conductive metal oxide, and/or a transparent conductive material. The electrode layer 115 may have a single layer structure or a multi layer structure. In example embodiments of the present invention, when the gate insulation layer 110 has a substantially level upper face, the electrode layer 115 may also have a substantially flat upper face due to the substantially flat upper face of the gate insulation layer 110.

Referring to FIGS. 9 and 11, a mask pattern 120 is formed on the electrode layer 115 in step S230. For example, the mask pattern 120 may be formed using photoresist, silicon oxide, silicon nitride, silicon oxynitride, etc. The mask pattern 120 may expose a portion of the electrode layer 115 under which the gate electrode 105 is positioned. In this case, an area of a portion of the electrode layer 115 exposed by the mask pattern 120 may be substantially smaller than an area of the gate electrode 105.

The electrode layer 115 is patterned using the mask pattern 120 as an etching mask, so that a source electrode 125 and a drain electrode 130 is formed on the gate insulation layer 110 in step S240. The source electrode 125 and the drain electrode 130 may be separated from each other on the gate insulation layer 110 by a distance (e.g., a predetermined distance). When the source and drain electrodes 125 and 130 are formed on the gate insulation layer 110, a portion of the gate insulation layer 110 may be exposed between the source electrode 125 and the drain electrode 130.

The portion of the gate insulation layer 110 exposed between the source and drain electrodes 125 and 130 may be damaged during an etching process for removing a portion of the electrode layer 115. Further, the gate insulation layer 110 may have a residual stress, an internal stress and/or etching by-products 128 including metal compounds, metallic particles. When an active pattern is formed on the gate insulation layer 110 having the above defects, an interface between the gate insulation layer 110 and the active pattern may be deteriorated. In case that the interface between the gate insulation layer 110 and the active pattern is damaged or deteriorated, a channel region of the oxide semiconductor device may be irregular and characteristics of the oxide semiconductor device may also be deteriorated.

In step S250, a cleaning treatment is performed on the portion of the gate insulation layer 110 exposed between the source and drain electrodes 125 and 130 as indicated by an arrow in FIG. 11. As illustrated in FIG. 12, a recess structure 118 is formed on the gate insulation layer 110 by partially removing a portion of the exposed gate insulation layer 110 with the cleaning treatment. That is, the cleaning treatment may remove a portion of the gate insulation layer 110 having the etched damage, the internal stress, the residual stress and/or the etching by-products, so that the recess structure 118 having a depth (e.g., a predetermined depth) may be provided on the gate insulation layer 110 substantially without defects as illustrated in FIG. 12. In example embodiments of the present invention, the cleaning treatment is carried out using a mixture including a solution for removing a metal compound and a pure water or a deionized water. For example, the cleaning treatment may be executed using a solution such as a solution including hydrogen fluoride, a solution including hydrogen chloride, a solution including phosphoric acid, a solution including potassium hydroxide, a solution including hydrogen bromide, a solution including iodine bromide, etc. These may be used alone or in combinations thereof.

Referring to FIGS. 9 and 12, the mask pattern 120 is removed from the source and drain electrodes 125 and 130 after forming the recess structure 118 on the gate insulation layer 110 in step S260. The mask pattern 120 may be removed by a dry etching process or a wet etching process. When the mask pattern 120 is removed, the source and drain electrodes 125 and 130 may be exposed.

After forming an active layer on the source electrode 125, the drain electrode 130 and the gate insulation layer 110 having the recess structure 118, an active pattern is formed on the gate insulation layer 110, the source electrode 125 and the drain electrode 130 by patterning the active layer through a photolithography process or an etching process using an additional etching mask in step S270. Therefore, an oxide semiconductor device having a construction substantially the same as or substantially similar to that of the oxide semiconductor device described with reference to FIG. 1 may be provided on the substrate 100.

Figure 13:
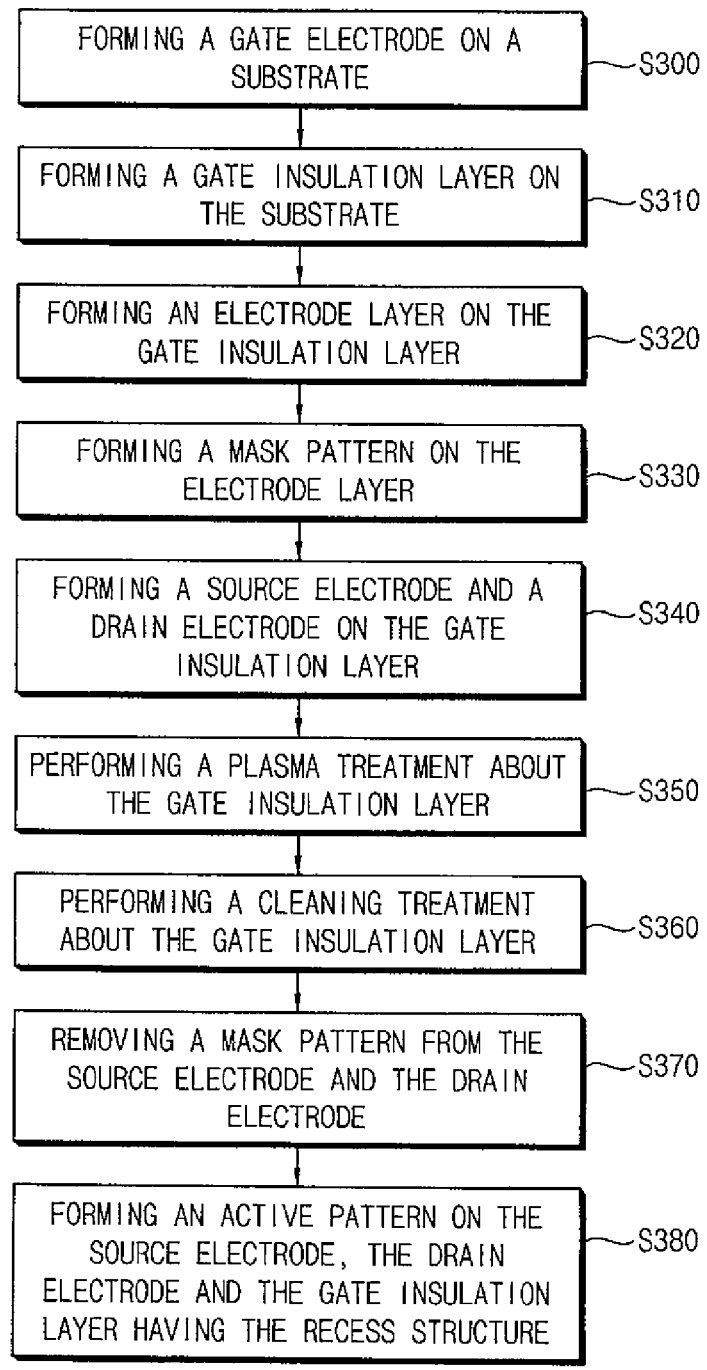

FIG. 13 is a flow chart illustrating a method of manufacturing an oxide semiconductor device in accordance with some example embodiments of the present invention. The method of manufacturing illustrated in FIG. 13 may include processes substantially the same as or substantially similar to those of the method described with reference to FIG. 2 except for a plasma treatment and a cleaning treatment for a gate insulation layer.

Referring to FIG. 13, a gate electrode is formed on a substrate in step S300, and then a gate insulation layer is formed on the substrate to cover the gate electrode in step S310. Here, the gate insulation layer may have a substantially level upper face while fully covering the gate electrode.

After an electrode layer is formed on the gate insulation layer in step S320, a mask pattern is formed on the electrode layer in step S330. The electrode layer may have a substantially level upper face substantially caused by that of the gate insulation layer. The mask pattern may expose a portion of the electrode layer under which the gate electrode is located.

The electrode layer is patterned using the mask pattern as an etching mask, such that a source electrode and a drain electrode is formed on the gate insulation layer in step S340. The source electrode and the drain electrode may be separated each other on the gate insulation layer by a distance (e.g., a predetermined distance) substantially centered around the gate electrode. Hence, a portion of the gate insulation layer between the source electrode and the drain electrode may be exposed. The portion of the gate insulation layer exposed between the source and drain electrodes may be damaged during an etching process for etching a portion of the electrode layer. Further, the gate insulation layer may have a residual stress, an internal stress and/or etching by-products including metal compounds and/or metallic particles after the etching process for forming the source and drain electrodes.

As illustrated in FIG. 13, a plasma treatment is performed on the gate insulation layer in step S350. The portion of the gate insulation layer between the source and drain electrodes may be primarily removed by the plasma treatment, so that a preliminary recess structure is formed on the gate insulation layer. In example embodiments of the present invention, the preliminary'recess structure may have a depth substantially smaller than or substantially similar to that of the recess structure 18 described with reference to FIG. 1 by controlling process conditions of the plasma treatment such as a time (e.g., length of time) of treating a plasma, a flow of a gas generating a plasma, etc. The plasma treatment may primarily remove damaged portions of the gate insulation layer and etching by-products remaining on the gate insulation layer. For example, the damaged portions and the etching by-products of the gate insulation layer may be partially removed or completely removed by the plasma treatment.

In step S360, a cleaning treatment is performed on the gate insulation layer having the preliminary recess structure formed by the plasma treatment. The cleaning treatment may be executed using a mixture including a solution for removing a metal compound and a pure water or a deionized water. In example embodiments of the present invention, the damaged portion and the etching by-products of the gate insulation layer are removed effectively and substantially completely from the gate insulation layer through the above-described plasma treatment and the following cleaning treatment. Further, a recess structure may be formed on a portion the gate insulation layer between the source and drain electrodes by expanding the preliminary recess structure formed on the gate insulation layer. That is, the recess structure may be formed from the preliminary recess structure by the cleaning treatment. In this case, the recess structure may have a depth substantially the same as or substantially similar to that of the recess structure 18 described with reference to the embodiment of FIG. 1.

Referring now to FIG. 13, the mask pattern is removed from the source and drain electrodes in step S370, and then an active layer is formed on the gate insulation layer, the source electrode and the drain electrode to fill the recess structure in step S380. The active layer may be formed using a semiconductor oxide. Examples of the semiconductor oxide may include a binary compound, a ternary compound, a quaternary compound, etc. Alternatively, the active layer may include the semiconductor oxide doped with additional elements such as lithium, sodium, manganese, nickel, palladium, copper, cadmium, carbon, phosphorus, titanium, zirconium, vanadium, ruthenium, germanium, tin, etc.

In step S380, an active pattern is formed on the gate insulation layer, the source electrode and the drain electrode by patterning the active layer using a photolithography process or an etching process using an additional etching mask. Therefore, an oxide semiconductor device having a construction substantially the same as or substantially similar to that of the oxide semiconductor device described with reference to FIG. 1 may be provided on the substrate. In this case, the active pattern may have stepped portions adjacent to the source and drain electrodes.

According to example embodiments of the present invention, the damage to the gate insulation layer and the etching by-products may be completely removed from the gate insulation layer by performing the plasma treatment and the cleaning treatment sequentially. Hence, an interface between the gate insulation layer and the active pattern may be uniform and substantially level. As a result, the oxide semiconductor device may exhibit improved electrical characteristics such as an increased charge mobility, a reduced threshold voltage variation, an increased operation current, etc. by reducing a thickness of a portion of the gate insulation layer on which a channel region of the oxide semiconductor device is formed.

Figure 14:
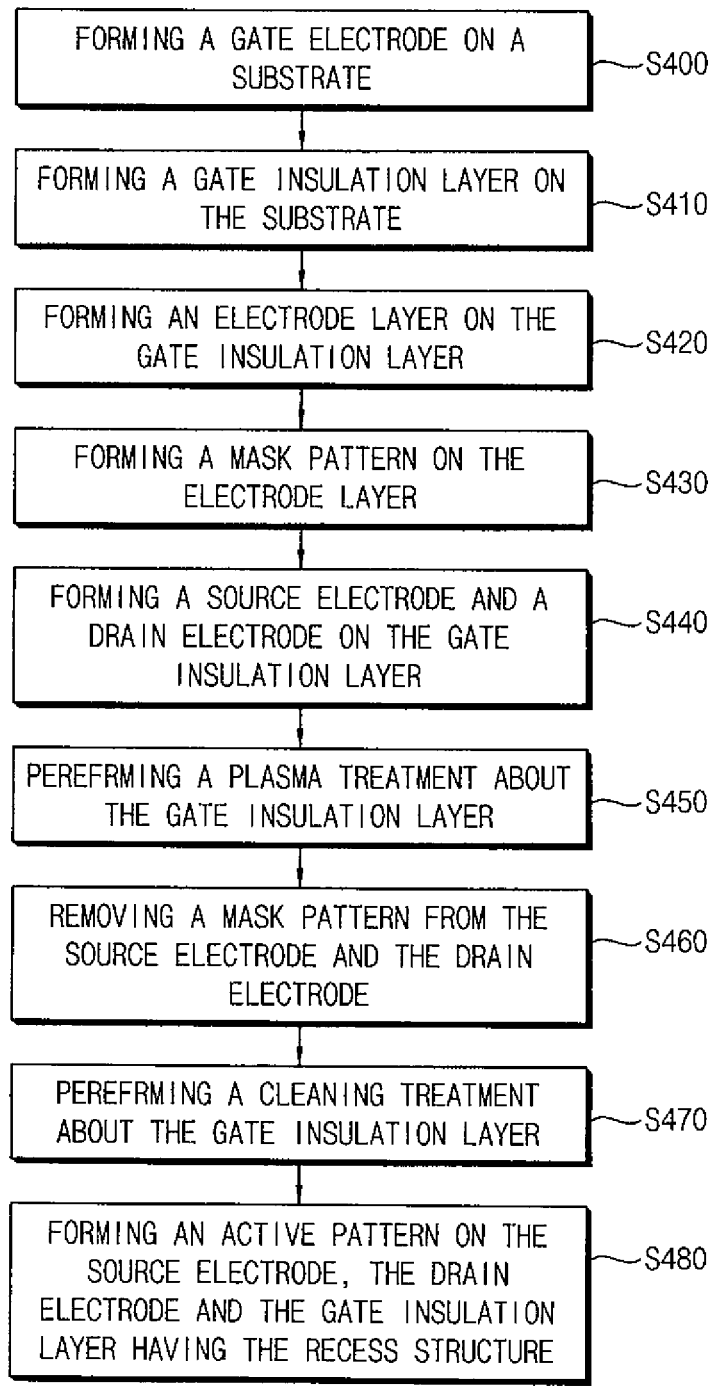

FIG. 14 is a flow chart illustrating a method of manufacturing an oxide semiconductor device in accordance with some example embodiments of the present invention. The method of manufacturing an oxide semiconductor device illustrated in FIG. 14 may include processes substantially the same as or substantially similar to those of the method of manufacturing an oxide semiconductor device described with reference to FIG. 2 except for a plasma treatment and a cleaning treatment of a gate insulation layer.

Referring to FIG. 14, after a gate electrode is formed on a substrate in step S400, a gate insulation layer is formed on the substrate to cover the gate electrode in step S410. For example, the gate insulation layer may have a relatively large thickness to completely cover the gate electrode on the substrate.

An electrode layer is formed on the gate insulation layer in step S420, and then a mask pattern is formed on the electrode layer in step S430. When the gate insulation layer has a substantially level upper face, the electrode layer may also have a substantially level upper face caused by that of the gate insulation layer. The mask pattern may be provided on the electrode layer by a photolithography process or an etching process using an additional etching mask, etc.

The electrode layer may be partially etched using the mask pattern as etching mask, and thus a source electrode and a drain electrode are respectively formed on a first portion and a second portion of the gate insulation layer in step S440. The source electrode and the drain electrode may be spaced apart on the gate insulation layer by a distance substantially the same as or substantially similar to a length of a channel region of the oxide semiconductor device.

A plasma treatment is performed on a portion of the gate insulation layer exposed by the source and drain electrodes in step S450. In this case, the plasma treatment may be substantially the same as or substantially similar to the plasma treatment described with reference to FIG. 3. A damaged and stressed portion of the gate insulation layer and etching by-products remaining on the gate insulation layer may be primarily removed by the plasma treatment, so that a preliminary recess structure may be formed on the gate insulation layer between the source and drain electrodes. Here, the preliminary recess structure may have a depth substantially smaller than or substantially similar to that of the recess structure 18 described with reference to FIG. 1.

After forming the preliminary recess structure on the gate insulation layer, the mask pattern is removed from the source and drain electrodes in step S460. The mask pattern may be removed by a dry etching process or a wet etching process.

A cleaning treatment is performed on the gate insulation layer having the preliminary recess structure in step S470. Here, the cleaning treatment may be substantially the same as or substantially similar to the cleaning treatment described with reference to FIG. 9. The damaged and stressed portion of the gate insulation layer and the etching by-products may be completely removed by the cleaning treatment. A recess structure may be provided on a portion the gate insulation layer between the source and drain electrodes by substantially extending a size (e.g., the depth) of the preliminary recess structure through the cleaning treatment. In example embodiments of the present invention, although damage to the gate insulation layer may be additionally caused while removing the mask pattern or etching by-products from the mask pattern may be additionally be left on the gate insulation layer, the damaged portion and the etching by-products may be efficiently removed from the gate insulation layer by the cleaning treatment which may be carried out after removing the mask pattern.

An active pattern is formed on the source electrode, the drain electrode and the gate insulation layer having the recess structure in step S480. In example embodiments of the present invention, after forming an active layer on the source and drain electrodes to fill the recess structure, the active pattern may be formed on the gate insulation layer, the source electrode and the drain electrode by partially etching the active layer with a photolithography process or an etching process using an additional etching mask. Thus, an oxide semiconductor device having a construction substantially the same as or substantially similar to that of the oxide semiconductor device described with reference to FIG. 1 or 8 may be provided on the substrate.

According to example embodiments of the present invention, the cleaning treatment may be performed on the plasma-treated gate insulation layer after removing the mask pattern, the damage to the gate insulation layer and the etching by-products remaining on the gate insulation layer may be completely removed. Further, the additional damaged portions of the gate insulation layer and the additional etching by-products remaining on the gate insulation layer may be effectively removed by the cleaning treatment. Therefore, the oxide semiconductor device may exhibit further improved electrical characteristics by enhancing uniformity and flatness of the channel region of the oxide semiconductor device.

Figure 15:
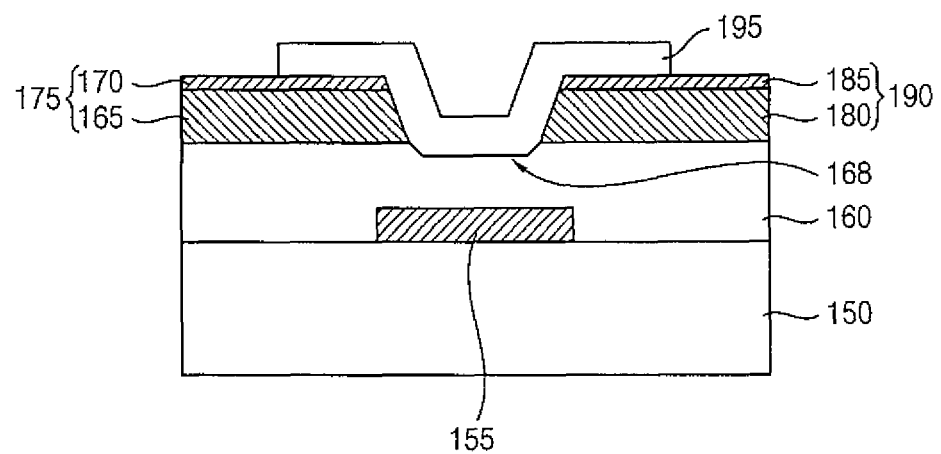

FIG. 15 is a cross-sectional view illustrating an oxide semiconductor device in accordance with some example embodiments of the present invention. The oxide semiconductor device in FIG. 15 may have a construction substantially the same as or substantially similar to that of the oxide semiconductor device described with reference to the embodiment of FIG. 1 except structures of a source electrode 175 and a drain electrode 190.

Referring to FIG. 15, according to one embodiment of the present invention, the oxide semiconductor device includes a gate electrode 155, a gate insulation layer 160 having a recess structure 168, a source electrode 175, a drain electrode 190 and an active pattern 195.

The gate electrode 155 is disposed on a substrate 150. The gate insulation layer 160 is positioned on the substrate 150 to substantially cover the gate electrode 155. The gate insulation layer 160 may have a substantially level upper face. Alternatively, the gate insulation layer 160 may have a stepped portion adjacent to the gate electrode 155.

The recess structure 168 may be provided on (or above) the gate insulation layer 160, and the active pattern 195 may be disposed on the source and drain electrodes 175 and 190 to fill the recess structure 168. In one embodiment, the recess structure 168 has a size and a shape substantially the same as or substantially similar to the size and shape of the recess structure 18 described with reference to FIG. 1.

In example embodiments of the present invention, the source electrode 175 may have a first electrode pattern 165 and a second electrode pattern 170, and the drain electrode 190 may have a third electrode pattern 180 and a fourth electrode pattern 185. Each of the first and third electrode patterns 165 and 180 may include a metal, an alloy, a transparent conductive material, etc. Each of the second and the fourth electrode patterns 170 and 185 may include a metal nitride, a metal oxide, etc. For example, the first and the third electrode patterns 165 and 180 may include chrome, aluminum, copper, molybdenum, titanium, tantalum, tungsten, neodymium, scandium, alloy of these metals, strontium ruthenium oxide, indium tin oxide, indium zinc oxide, zinc oxide, tin oxide, carbon nanotubes, etc. These may be used alone or in combinations thereof. Further, each of the second and the fourth electrode patterns 170 and 185 may include a metal nitride and/or a nitride of a transparent conductive material resulting from the first and the third electrode patterns 165 and 180. For example, the second and the fourth electrode patterns 170 and 185 may include chrome nitride ($CrN_x$), aluminum nitride ($AlN_x$), titanium nitride ($TiN_x$), tantalum nitride ($TaN_x$), tungsten nitride ($WN_x$), molybdenum nitride ($MoN_x$), neodymium nitride ($NdN_x$), scandium nitride ($ScN_x$), ruthenium nitride ($RuN_x$), nitrides of alloys containing these metals, strontium ruthenium oxynitride, indium tin oxynitride, indium zinc oxynitride, zinc oxynitride, tin oxynitride, carbon nanotube nitride, etc. These may be used alone or in combinations thereof. When the second and the fourth electrode patterns 170 and 185 include a metal nitride or a nitride of a transparent conductive material, the first and the third electrode patterns 165 and 180 may be effectively protected while successively performing a plasma treatment and/or a cleaning treatment. Thus, electrical characteristics of the oxide semiconductor device may be enhanced by preventing or mitigating additional damage or deterioration of the source and drain electrodes 175 and 190.

Figure 16:
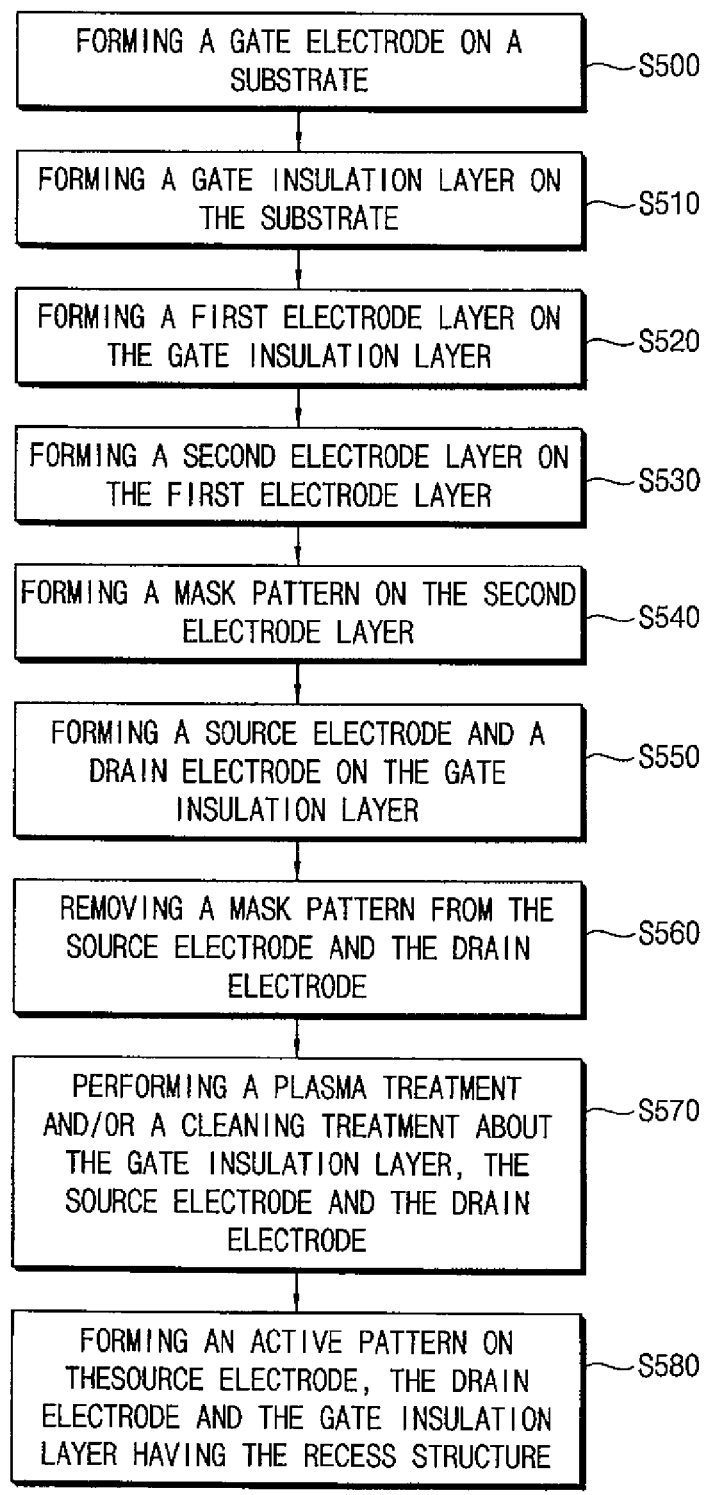

FIG. 16 is a flow chart illustrating a method of manufacturing an oxide semiconductor device in accordance with some example embodiments of the present invention. FIGS. 17 to 20 are cross-sectional views illustrating a method of manufacturing an oxide semiconductor device in accordance with some example embodiments of the present invention. In FIGS. 16 to 20, the method may provide an oxide semiconductor device having a construction substantially the same as or substantially similar to that of the oxide semiconductor device described with reference to FIG. 15, however, the method illustrated in FIGS. 16 to 20 may be employed in manufacturing other oxide semiconductor devices having various constructions including gate electrodes, gate insulation layers, active patterns, source electrodes, drain electrodes, etc.

Figure 17:
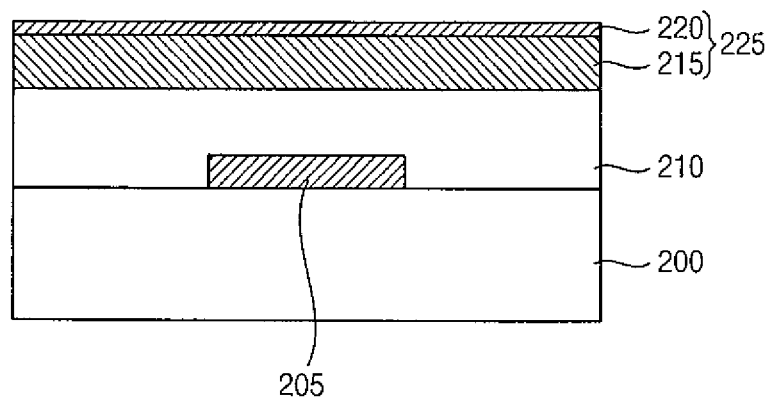

Referring to FIGS. 16 and 17, a gate electrode 205 is formed on a substrate 200 in step S500, and then a gate insulation layer 210 is formed on the gate electrode 205 and the substrate 200 in step S510. The gate insulation layer 210 may have a substantially level upper face.

After a first electrode film 215 is formed on the gate insulation layer 210 in step S520, a second electrode film 220 is formed on the first electrode 215 in step S530. Thus, an electrode layer 225 including the first and the second electrode films 215 and 220 may be provided on the gate insulation layer 210.

The first electrode film 215 may be formed using a metal, an alloy, a transparent conductive material, etc. For example, the first electrode film 215 may be formed using chrome, aluminum, molybdenum, titanium, tantalum, tungsten, neodymium, scandium, ruthenium, alloy of these metals, strontium ruthenium oxide, indium tin oxide, indium zinc oxide, zinc oxide, tin oxide, carbon nanotubes, etc. These may be used alone or in combinations thereof. Further, the first electrode film 215 may be formed on the gate insulation layer 210 by a sputtering process, a spray process, a chemical vapor deposition process, an atomic layer deposition process, a vacuum evaporation process, a printing process, etc.

The second electrode film 220 may be formed using a metal nitride, a nitride of a transparent conductive material. For example, the second electrode film 220 may include chrome nitride, aluminum nitride, titanium nitride, tantalum nitride, tungsten nitride, molybdenum nitride, neodymium nitride, scandium nitride, ruthenium nitride, nitride of alloy of these metals, strontium ruthenium oxynitride, indium tin oxynitride, indium zinc oxynitride, zinc oxynitride, tin oxynitride, carbon nanotube nitride, etc. These may be used alone or in combinations thereof.

In example embodiments, the second electrode film 220 may be formed by performing a nitration treatment on the first electrode film 215. That is, a portion of the first electrode film 215 may be changed into the second electrode film 220 by nitriding the first electrode film 215. For example, the nitration treatment may include thermally treating the first electrode film 215 under an atmosphere containing nitrogen. The atmosphere containing nitrogen may include nitrogen ($N_2$), nitric oxide (NO), nitrous oxide ($N_2O$), nitrogen dioxide ($NO_2$), ammonia ($NH_3$), etc. These may be used alone or in combinations thereof. In some example embodiments, the nitration treatment may include treating the first electrode film 215 with a plasma generated from a gas containing nitrogen. For example, the gas for generating the plasma may include nitrogen, nitric oxide, nitrous oxide, nitrogen dioxide, ammonia, etc. These may be used alone or in combinations thereof.

Figure 18:
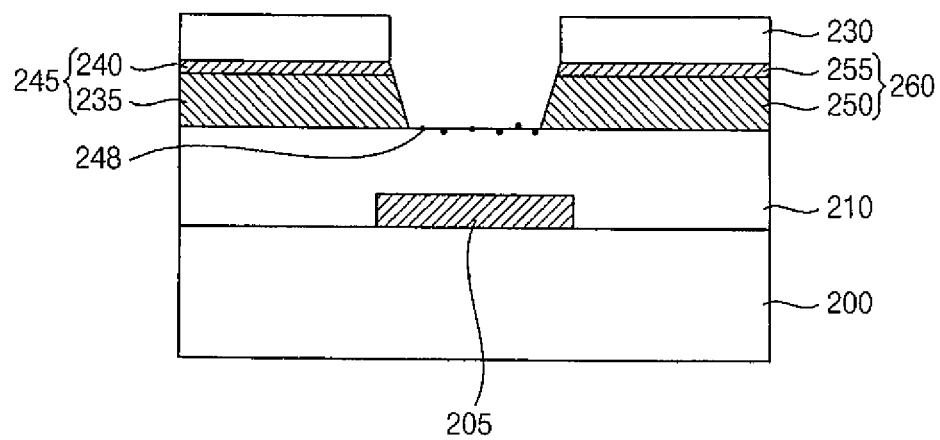

Referring to FIGS. 16 and 18, a mask pattern 230 is formed on the second electrode film 220 in step S540. The electrode layer 225 may be partially etched using the mask pattern 230 as an etching mask, so that a source electrode 245 and a drain electrode 260 is formed on the gate insulation layer 210 in step S550. The source electrode 245 may include a first electrode pattern 235 and a second electrode pattern 240 formed on a first portion of the gate insulation layer 210. The drain electrode 260 may include a third electrode pattern 250 and a fourth electrode pattern 255 formed on a second portion of the gate insulation layer 210. Namely, the first electrode film 215 may be patterned to form the first electrode pattern 235 and the third electrode pattern 250, and the second electrode film 220 may be patterned to form the second electrode pattern 240 and the fourth electrode pattern 255.

As illustrated in FIG. 18, etching by-products 248 may remain on the gate insulation layer 210 while etching the electrode layer 225 to form the source and drain electrode 245 and 260. Additionally, the gate insulation layer 210 may be damaged in an etching process for the electrode layer 225 and may also have a residual stress or an internal stress therein.

Figure 19:
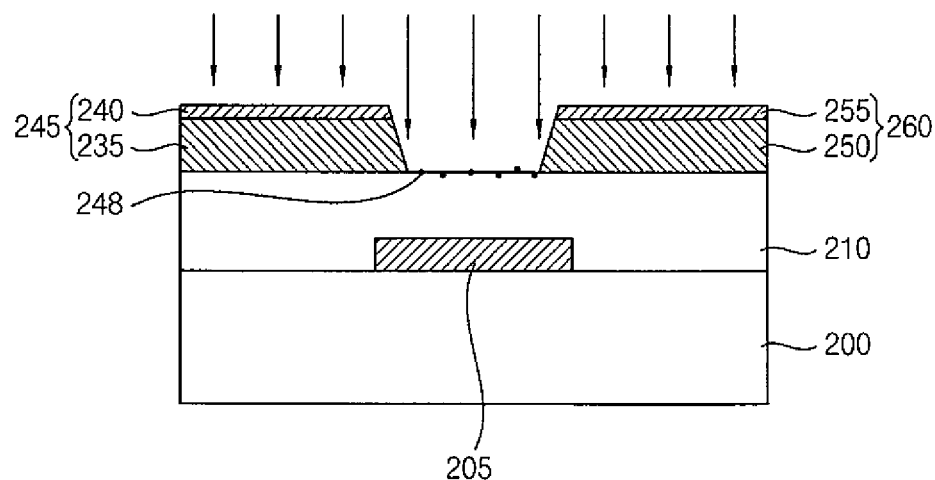

Referring to FIGS. 16 and 19, the mask pattern 75 is removed from the source and drain electrodes 245 and 260 in step S560. A plasma treatment and/or a cleaning treatment is performed on the gate insulation layer 210 between the source and drain electrodes 245 and 260 in step S570. Thus, a recess structure 218 (see FIG. 20) is formed on the gate insulation layer 210 between the source and drain electrodes 245 and 260. In this case, the plasma treatment may be substantially the same as or substantially similar to the plasma treatment described with reference to FIGS. 3 and 7, and the cleaning treatment may be substantially the same as or substantially similar to the cleaning treatment described with reference to FIGS. 9 and 11.

According to example embodiments of the present invention, even though the plasma treatment and/or the cleaning treatment are performed on the gate insulation layer 210 after removing the mask pattern 230, etching damage to the first and the third electrode patterns 235 and 250 may be effectively protected against or reduced because the first and the third electrode patterns 235 and 250 are protected by the second and the fourth electrode patterns 240 and 255.

Figure 20:
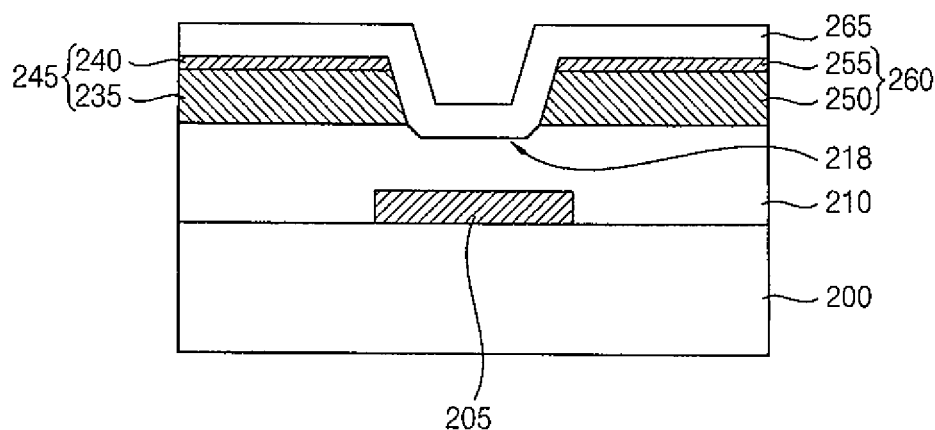

Referring to FIGS. 16 and 20, an active layer 265 is formed on the source electrode 245, the drain electrode 260 and the gate insulation layer 210 having the recess structure 218. That is, the active layer 265 filling the recess structure 218 may be formed on the gate insulation layer 210, the second electrode pattern 240 and the fourth electrode pattern 255.

In step S580, an active pattern is formed on the gate insulation layer 210, the source electrode 245 and the drain electrode 260 by a photolithography process or an etching process using an additional etching mask. The active pattern may completely fill the recess structure 218. Thus, an oxide semiconductor device having a construction substantially the same as or substantially similar to that of the oxide semiconductor device described with reference to FIG. 15 may be provided on the substrate 200.

Figure 21:
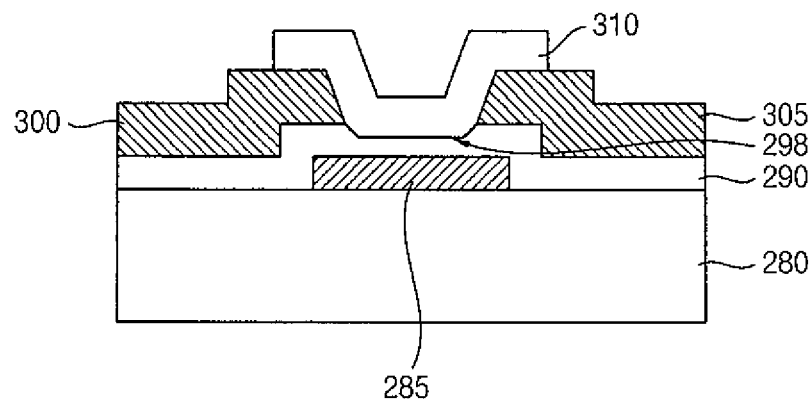

FIG. 21 is a cross-sectional view illustrating an oxide semiconductor device in accordance with some example embodiments of the present invention.

Referring to FIG. 21 the oxide semiconductor device may include a gate electrode 285, a gate insulation layer 290 having a recess structure 298, a source electrode 300, a drain electrode 305 and an active pattern 310.

In example embodiments, the gate insulation layer 290 may be uniformly formed on a substrate 280 along a profile of the gate electrode 285. In this case, the gate insulation layer 290 may include stepped portions adjacent to end portions of the gate electrode 285, respectively. Further, the gate insulation layer 290 may have a substantially small thickness. For example, the gate insulation 290 may have a thickness of about 500 Å to about 1,000 Å based on an upper face of the gate electrode 285. When the gate insulation layer 290 has stepped portions, each element of the oxide semiconductor device may also have a structure including a stepped portion.

The recess structure 298 may be located on the gate insulation layer 290. The recess structure 298 may have a construction substantially the same as or substantially similar to that of the recess structure 18 described with reference to FIG. 1. In example embodiments, the recess structure 298 may have a depth of about 100 Å to about 300 Å. Hence, a ratio between the depth of the recess structure 298 and the thickness of the gate insulation layer 290 may be in a range from about 1.0:1.7 to about 1.0:10.0. That is, when the gate insulation layer 290 includes a stepped portion, the ratio between depth of the recess structure 298 and the thickness of the gate insulation layer 290 may be reduced. The recess structure 298 may include an inclined sidewall having a relatively small first angle of inclination with respect to an axis or a line substantially perpendicular to the substrate 280.

Each of the source electrode 300 and the drain electrode 305 may be positioned on the gate insulation layer 290 having the recess structure 298. For example, the source electrode 300 and the drain electrode 305 may be spaced apart by a distance substantially corresponding to a width of the recess structure 298. In example embodiments of the present invention, the source and drain electrodes 300 and 305 include stepped portions corresponding to the stepped portions of the gate insulation layer 290. For example, each of the source and drain electrodes 300 and 305 may include a stepped portion adjacent to the stepped portion of the gate insulation layer 290. Further, each of the source and drain electrodes 300 and 305 may have a relatively large second angle of inclination with respect to the axis, the line or the direction substantially perpendicular to the gate electrode 285. In some example embodiments, each of the source and drain electrodes 300 and 305 may have a construction substantially the same as or substantially similar to that of the source and drain electrodes 175 and 190 described with reference to FIG. 15.

The active pattern 310 may be disposed on the source and drain electrodes 300 and 305 to fill the recess structure 298. In this case, the active pattern 310 on the gate insulation layer 290 may contact a sidewall of the recess structure 298 and sidewalls of the source and drain electrodes 300 and 305. Thus, a lower portion of the active pattern 310 may have an inclined sidewall having a relatively small first inclined angle, and a central portion of the active pattern 310 may have an inclined sidewall having a relatively large second inclined angle. Further, because the active pattern 310 contacting the gate insulation layer 290 may be disposed on the source and drain electrodes 300 and 305, the active pattern 310 may include stepped portions adjacent to the stepped portions of the gate insulation layer 290. In some example embodiments, end portions of the active pattern 310 may extend on the source electrode 300 and the drain electrode 305, respectively. Here, the active pattern 310 may have additional stepped portions respectively adjacent to the stepped portions of the source and drain electrodes 300 and 305. For example, the active pattern 310 filling the recess structure 298 may have a substantially double-stepped structure.

Figure 22:
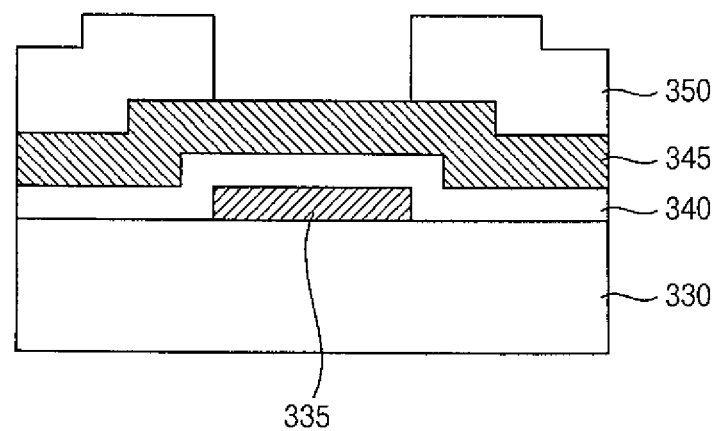
Figure 23:
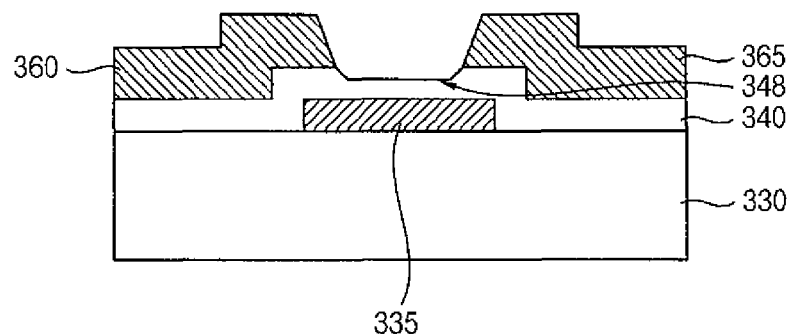

FIGS. 22 and 23 are cross-sectional views illustrating a method of manufacturing an oxide semiconductor device in accordance with some example embodiments of the present invention. In FIGS. 22 and 23, the method may provide an oxide semiconductor device having a construction substantially the same as or substantially similar to that of the oxide semiconductor device described with reference to FIG. 21, however, the method illustrated in FIGS. 22 to 23 may be employed in manufacturing other oxide semiconductor devices having various constructions including gate electrodes, gate insulation layers, active patterns, source electrodes, drain electrodes, etc.

Referring to FIG. 22, a gate electrode 335 is formed on a substrate 330 including a transparent insulation material. In example embodiments of the present invention, the gate electrode 335 is formed by patterning a conductive layer after forming the conductive layer on the substrate 330. For example, the gate electrode 335 may be formed by a sputtering process, a chemical vapor deposition process, an atomic layer deposition process, a vacuum evaporation process, a printing process, etc. In some example embodiments, a buffer layer may be additionally formed on the substrate 330 before forming the gate electrode 335.

A gate insulation layer 340 is formed on the gate electrode 335 and the substrate 330. The gate insulation layer 340 may be uniformly formed on a substrate 330 along a profile of the gate electrode 335. When the gate insulation layer 340 has a uniform thickness on the substrate 330, the gate insulation layer 340 may include stepped portions adjacent to the gate electrode 335. For example, stepped portions may be formed over portions of the gate insulation layer 340 adjacent to both end portions of the gate electrode 335. The gate insulation layer 340 having a relatively small thickness may be formed using a silicon compound and/or a metal oxide.

An electrode layer 345 is formed on the gate insulation layer 340. The electrode layer 345 may be conformally formed on the gate insulation layer 340 along a profile of the gate electrode 335. Thus, the electrode layer 345 may also have stepped portions adjacent to the stepped portions of the gate insulation layer 340. In some example embodiments, the electrode layer 345 may have a construction substantially the same as or substantially similar to that of the electrode layer 225 described with reference to FIG. 17.

A mask pattern 350 is formed on the electrode layer 345. The mask pattern 350 may be formed using photoresist, an oxide, a nitride, an oxynitride, etc. Further, the mask pattern 350 may have a single layer structure or a multi layer structure.

Referring to FIG. 23, the electrode layer 345 may be partially etched using the mask pattern 350. Accordingly, a source electrode 360 and a drain electrode 365 may be formed on a first portion and a second portion of the gate insulation layer 340, respectively. In example embodiments of the present invention, the source electrode 360 and the drain electrode 365 have stepped portions adjacent to the stepped portions of the gate insulation layer 340, respectively. Due to the shapes of the source and drain electrodes 360 and 365, a portion of gate insulation layer 340 between the source and drain electrodes 360 and 365 may be exposed. The exposed portion of the gate insulation layer 340 may be damaged during an etching process for patterning the electrode layer 345 to form the source and drain electrodes 360 and 365. Further, the gate insulation layer 340 may have a residual stress, an internal stress and/or etching by-products remaining thereon.

A recess structure 348 may be formed on the gate insulation layer 340 by performing a plasma treatment and/or a cleaning treatment on the exposed portion of the gate insulation layer 340. Namely, the recess structure 348 may be formed between the source and drain electrodes 360 and 365 by partially etching the exposed portion of the gate insulation layer 340. In this case, the plasma treatment may be substantially the same as or substantially similar to the plasma treatment described with reference to FIGS. 3 and 7. Additionally, the cleaning treatment may be substantially the same as or substantially similar to the cleaning treatment described with reference to FIGS. 9 and 11.

An active pattern may be formed on the gate insulation layer 340, the source electrode 360 and the drain electrode 365, such that the oxide semiconductor device may be formed on the substrate 330. In this case, the oxide semiconductor device may have a construction substantially the same as or substantially similar to that of the oxide semiconductor device described with reference to FIG. 21.

Evaluation of Characteristics of Oxide Semiconductor Devices

Hereinafter, electrical characteristics of oxide semiconductor devices according to Examples and Comparative Examples will be described.

Example 1

A gate electrode was formed on a substrate, and then a gate insulation layer was formed on the substrate to cover the gate electrode. After forming an electrode layer on the gate insulation layer, a source electrode and a drain electrode were formed on the gate insulation layer by patterning the electrode layer. A plasma treatment was performed on the gate insulation layer between the source and drain electrodes using a plasma generated from a mixture of sulfur hexafluoride ($SF_6$) and oxygen ($O_2$). A recess structure was formed on the gate insulation layer by the plasma treatment. An active pattern was formed on the gate insulation layer, the source electrode and the drain electrode, thereby obtaining an oxide semiconductor device.

Example 2

A gate electrode was formed on a substrate, and then a gate insulation layer was formed on the substrate to cover the gate electrode. After forming an electrode layer on the gate insulation layer, a source electrode and a drain electrode were formed on the gate insulation layer by patterning the electrode layer. A cleaning treatment was performed on the gate insulation layer between the source and drain electrodes using a solution including hydrogen fluoride. A recess structure was formed on the gate insulation layer by the cleaning treatment. An active pattern was formed on the gate insulation layer, the source electrode and the drain electrode, so that an oxide semiconductor device was provided on the substrate.

Example 3

After gate electrode formed on a substrate, a gate insulation layer was formed on the substrate to cover the gate electrode.

After forming an electrode layer on the gate insulation layer, a source electrode and a drain electrode were formed on the gate insulation layer by patterning the electrode layer. A plasma treatment was primarily performed on the gate insulation layer between the source and drain electrodes using a plasma generated from a mixture of sulfur hexafluoride and oxygen. Then, a cleaning treatment was performed on the gate insulation layer using a solution including hydrogen fluoride. A recess structure was formed on the gate insulation layer by the plasma treatment and the cleaning treatment. An active pattern was formed on the gate insulation layer, the source electrode and the drain electrode, thereby obtaining an oxide semiconductor device.

Comparative Example

A gate electrode was formed on a substrate, and then a gate insulation layer was formed on the substrate to cover the gate electrode. After forming an electrode layer on the gate insulation layer, a source electrode and a drain electrode were formed on the gate insulation layer by patterning the electrode layer. Without performing a plasma treatment and/or a cleaning treatment on the gate insulation layer, an active pattern was formed on the gate insulation layer, the source electrode and the drain electrode, to thereby obtain an oxide semiconductor device.

Table shows measured results of charge mobilities and variation of threshold voltages of oxide semiconductor devices according to Examples 1 to 3 and Comparative Example.

TABLE

|  | Comparative Example | Example 1 | Example 2 | Example 3 |
|---|---|---|---|---|
| charge mobility | 4.10 cm$^2$/Vs | 8.20 cm$^2$/Vs | 4.55 cm$^2$/Vs | 8.43 cm$^2$/Vs |
| variation of threshold voltages | 0.98 V/decade | 0.78 V/decade | 0.83 V/decade | 0.78 V/decade |

As shown in the above Table, when the plasma treatment and/or the cleaning treatment are performed on the gate insulation layers according to Example 1, Example 2, and Example 3, the charge mobility of the oxide semiconductor devices are increased by about 1.73 times on average, while the variation of threshold voltages of the oxide semiconductor devices are decreased by about 18.7% on average, comparing with Comparative Example in which the plasma treatment and/or the cleaning treatment is not carried out. When both of the plasma treatment and the cleaning treatment are performed on the gate insulation layer according to Example 3, the charge mobility of the oxide semiconductor device greatly increases and the variation of threshold voltages of the oxide semiconductor device considerably decreases. Therefore, electrical characteristics of the oxide semiconductor device may be improved when the plasma treatment and/or the cleaning treatment is performed on the gate insulation layer of the oxide semiconductor device.

Display Devices and Methods of Manufacturing Display Devices

Figure 24:
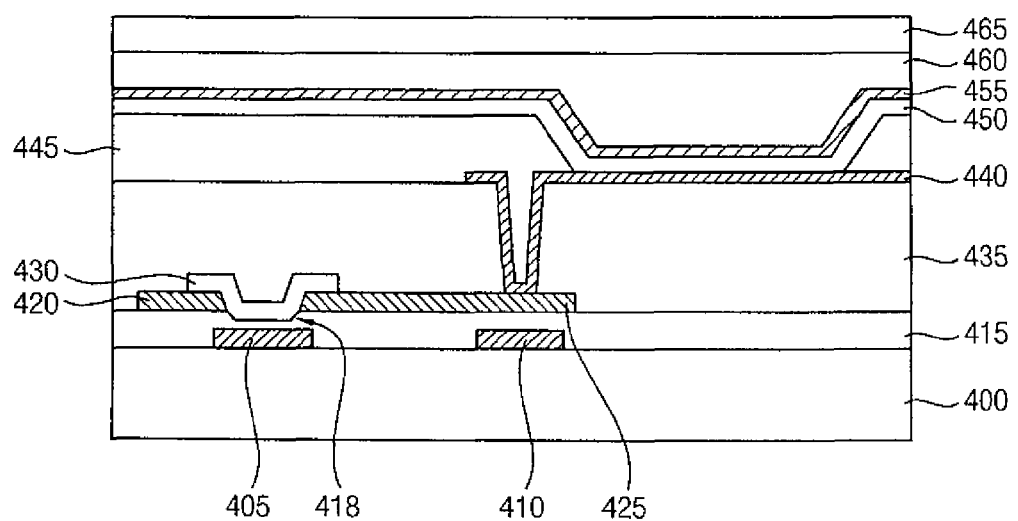

FIG. 24 is a cross-sectional view illustrating a display device including an oxide semiconductor device in accordance with example embodiments of the present invention. The display device illustrated in FIG. 24 may include a light emitting layer 450. However, the oxide semiconductor device may be employed in other display devices such as a liquid crystal display device, a flexible display device, etc. Further, the oxide semiconductor device illustrated in FIG. 24 may have a construction substantially the same as or substantially similar to that of the oxide semiconductor device described with reference to FIG. 1. However, the oxide semiconductor device described with reference to FIG. 15 or FIG. 21 may be employed in the display device illustrated in FIG. 24.

Referring to FIG. 24, an oxide semiconductor device is provided on a first substrate 400. In example embodiments of the present invention, the oxide semiconductor device includes a gate electrode 405, a gate insulation layer 415 having a recess structure 418, a source electrode 420, a drain electrode 425 and an active pattern 430.

A gate line 410 is disposed on the first substrate 400. The gate line 410 is connected to the gate electrode 405. In one embodiment, the gate line 410 includes a material substantially the same as or substantially similar to that of the gate electrode 405. The gate line 410 may extend on the first substrate 400 in a first direction.

The gate insulation layer 415 is disposed on the first substrate 400 to cover the gate electrode 405 and the gate line 410. The gate insulation layer 415 may have a substantially level upper face. Alternatively, the gate insulation layer 415 may have stepped portions adjacent to the gate electrode 405 and the gate line 410 such as the gate insulation layer 290 described with reference to FIG. 21. In some example embodiments of the present invention, a buffer layer is disposed between the gate electrode 405 and the first substrate 400, and between the gate line 410 and the first substrate 400. The buffer layer may prevent or mitigate the diffusion of moisture or impurities, and the gate electrode 405 and the gate line 410 may be relatively easily formed on the first substrate 400 because of the buffer layer.

The source electrode 420 and the drain electrode 425 are positioned on a first portion and a second portion of the gate insulation layer 415 substantially centered around the gate electrode 405. That is, the source electrode 420 and the drain electrode 425 may be symmetrically positioned and centered around the recess structure 418 of the gate insulation layer 415. A data line may be connected to the source electrode 420. The drain electrode 425 may extend on the gate insulation layer 415 over the gate line 410. Here, the data line may extend in a second direction substantially perpendicular to the first direction.

The active pattern 430 is disposed on the gate insulation layer 415, the source electrode 420 and the drain electrode 425 to fill the recess structure 418. In example embodiments of the present invention, a lower portion of the active pattern 430 may have a relatively small first inclined angle with respect to an axis, a line or a direction substantially perpendicular to the substrate 400. Additionally, a central portion of the active pattern 430 may have a relatively large second inclined angle relative to the axis, the line or the direction substantially perpendicular to the gate electrode 405.

An insulation layer 435 is disposed on the first substrate 400 to cover the oxide semiconductor device having the above-described construction. The insulation layer 435 may have a substantially flat upper face to improve a light efficiency of a light emitting structure disposed on the insulation layer 435. A hole is formed through the insulation layer 435 to expose an extending portion of the drain electrode 425. In example embodiments, the insulation layer 435 may include a transparent insulation material. For example, the insulation layer 435 may include acryl-based resin, epoxy resin, phenol resin, polyamide-based resin, polyimide-based resin, unsaturated polyester-based resin, polyphenylene-based resin, polyphenylsulfide-based resin, benzocyclobutene (BCB), etc. These may be used alone or in combinations thereof.

The light emitting structure is positioned on the insulation layer 435. In example embodiments, the light emitting structure may include a first electrode 440, the light emitting layer 450 and a second electrode 455. The first and the second electrodes 440 and 455 may include transparent conductive materials, transflective conductive materials or reflective conductive materials according to an emission type of the display device. For example, the display device may be a top emission type, a bottom emission type or a dual emission type display in accordance with materials included in the first and the second electrodes 440 and 455.

According to example embodiments of the present invention, the first electrode 440 of the light emitting structure serves as a pixel electrode of the display device. The first electrode 440 of the light emitting structure is electrically connected to the oxide semiconductor device. That is, the first electrode 440 may pass through the hole of the insulation layer 435 to make contact with an exposed portion of the drain electrode 425. In this case, the first electrode 440 is disposed on the exposed portion of the drain electrode 425, a sidewall of the hole of the insulation layer 435 and the insulation layer 435. In some example embodiments, a contact structure or a pad structure is provided in the hole of the insulation layer 435, so that the first electrode 440 is electrically connected to the drain electrode 425 through the contact structure. Here, the contact structure or the pad structure may have a single layer structure or a multi layer structure.

A pixel defining layer 445 is disposed on the insulation layer 435 covering the oxide semiconductor device. That is, the pixel defining layer 445 is positioned on a portion of the insulation layer 435 covering the oxide semiconductor device. In this case, the pixel defining layer 445 may extend to a region in which the drain electrode 425 is connected to the first electrode 440. The pixel defining layer 445 may divide adjacent pixels of the display device. The pixel defining layer 445 may include an insulation material. For example, the pixel defining layer 445 may include polyacryl-based resin, polyimide-based resin, a silica-based inorganic material, etc.

An opening is formed through the pixel defining layer 445 to expose a portion of the first electrode 440. The light emitting layer 450 and the second electrode 455 of the light emitting structure is uniformly disposed on the exposed portion of the first electrode 440, a sidewall of the opening and the pixel defining layer 445 along a profile of the opening.

In example embodiments of the present invention, a plurality of openings is provided through the pixel defining layer 445 in a plurality of pixels of the display device. Each of the openings may partially expose a portion of first electrode 440 in each pixel. In this case, the first electrode 440 is disposed only in the opening of the pixel defining layer 445. Alternatively, the first electrode 440 may extend beneath the pixel defining layer 310, so that the first electrode 440 is partially overlapped relative to the pixel defined layer 445. A region including the pixel defining layer 445 may substantially correspond to a non-luminescent region of the display device, and another region having the opening of the pixel defining layer 445 may substantially correspond to a luminescent region of the display device.

Referring now to FIG. 24, the light emitting layer 450 may include an organic material having a relatively small molecular weight, an organic material having a relatively large molecular weight, etc. In example embodiments, the light emitting layer 450 may have a multi layer structure that may include an organic light emitting layer, a hole injection layer (HIL), a hole transport layer (HTL), an electron injection layer (EIL), an electron transport layer (ETL), etc. As illustrated in FIG. 24, although the light emitting layer 450 is disposed on the first electrode 440 and the pixel defining layer 445, a position of the light emitting layer 450 is not limited. For example, the light emitting layer 450 may be located only on the first electrode 440 in the opening of the pixel defining layer 445.

A protection layer 460 is disposed on the light emitting structure. In example embodiments, the protection layer 460 may protect underlying structures including the light emitting structure. Additionally, the protection layer 460 may serve as a sealing member of the display device. For example, the protection layer 460 may include a transparent insulation material such as glass, quartz, transparent plastic, transparent ceramic, etc. A second substrate 465 substantially corresponding to the first substrate 400 is disposed on the protection layer 460. The second substrate 465 may include a transparent insulation material. For example, the second substrate 465 may include a glass substrate, a quartz substrate, a transparent plastic substrate, a transparent ceramic substrate, etc. In some example embodiments, the second substrate 465 may not be provided on the protection layer 460 in accordance with a construction of the protection layer 460 and/or a material of the protection layer 460. Alternatively, the protection layer 460 may be omitted according to a construction of the second substrate 465 and/or a material in the second substrate 460.

In example embodiments, the display device may include the oxide semiconductor device having improved electrical characteristics such as an increased operation current, a reduced threshold voltage variation, an increased charge mobility in a channel region, etc. Therefore, a thickness of the display device may be reduced, and a resolution of image displayed by the display device may be improved. Further, the display device may ensure an improved display speed and a high quality of image.

FIGS. 25 to 28 are cross-sectional views illustrating a method of manufacturing a display device including an oxide semiconductor device in accordance with example embodiments. In FIGS. 25 to 28, the method may provide a display device having a construction substantially the same as or substantially similar to that of the oxide semiconductor device described with reference to FIG. 24, however, the method illustrated in FIGS. 25 to 28 may be employed in manufacturing other display devices such as a liquid crystal display device or an electrophoretic display device by replacing or substituting elements such as a light emitting layer, a pixel defining layer, a first electrode, etc.

Figure 25:
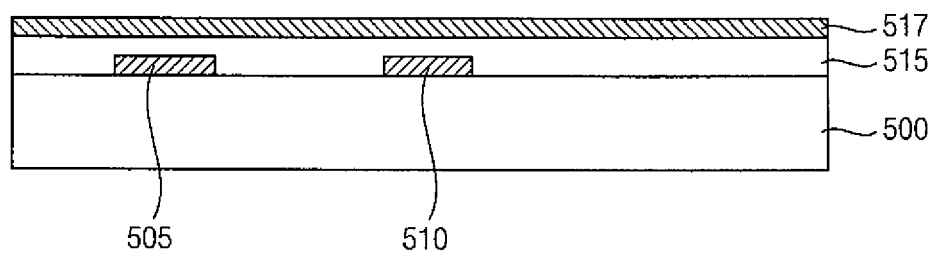

Referring to FIG. 25, a gate electrode 505 and a gate line 510 is formed on a first substrate 500. In example embodiments, after forming a conductive layer on the first substrate 500, the gate electrode 505 and the gate line 510 may be formed on the first substrate 500 by partially etching the conductive layer through a photolithography process.

A gate insulation layer 515 is formed on the first substrate 500 to cover the gate electrode 505 and the gate line 510. The gate insulation layer 515 may have a relatively large thickness to completely cover the gate electrode 505 and the gate line 510. In some example embodiments, the gate insulation layer 515 having a relatively small thickness is uniformly formed on the first substrate 500 along profiles of the gate electrode 505 and the gate line 510.

An electrode layer 517 is formed on the gate insulation layer 515. The electrode layer 517 is conformally formed on the gate insulation layer 515. In some example embodiments, the electrode layer 517 may have a construction including at least two electrode films substantially the same or substantially similar to those of the electrode layer 225 described with reference to FIG. 17.

Figure 26:
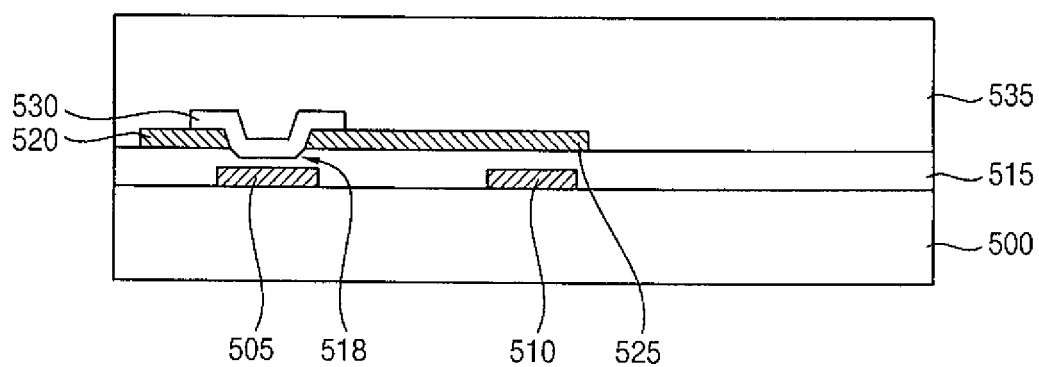

Referring to FIG. 26, a source electrode 520 and a drain electrode 525 is formed on the gate insulation layer 515 by patterning the electrode layer 517. The source and drain electrodes 520 and 525 may be separated each other on the gate insulation layer 515 substantially centered around the gate electrode 505. The drain electrode 525 may extend on a portion of the gate insulation layer 515 under which the gate line 510 is located.

The gate insulation layer 515 may be damaged in an etching process for forming the source and drain electrodes 520 and 525. Further, etching by-products may remain on the gate insulation layer 515 after the etching process. Thus, a recess structure 515 may be formed on the gate insulation layer 515 by performing a plasma treatment and/or a cleaning treatment on the gate insulation layer 515 to remove the damage to the gate insulation layer 515 and the etching by-products remaining on the gate insulation layer 515. As described above, the gate insulation layer 515 may have a recess structure 518 after the plasma treatment and/or the cleaning treatment.

An active pattern 530 is formed on the source electrode 520, the drain electrode 525 and the gate insulation layer 515 having the recess structure 518. The active pattern 530 may be formed using a semiconductor oxide, amorphous silicon, polysilicon, partially crystallized silicon, silicon containing micro crystals, etc. Accordingly, an oxide semiconductor device including the gate electrode 505, the gate insulation layer 515, the source electrode 520, the drain electrode 525 and the active pattern 530 may be provided on the first substrate 500.

An insulation layer 535 is formed on the first substrate 500 to cover the oxide semiconductor device. The insulation layer 535 may be formed using a transparent insulation material. The insulation layer 535 may have a substantially level upper face. In this case, an upper portion of the insulation layer 535 may be planarized by a planarization process such as a chemical mechanical polishing process, an etch-back process, etc.

Figure 27:
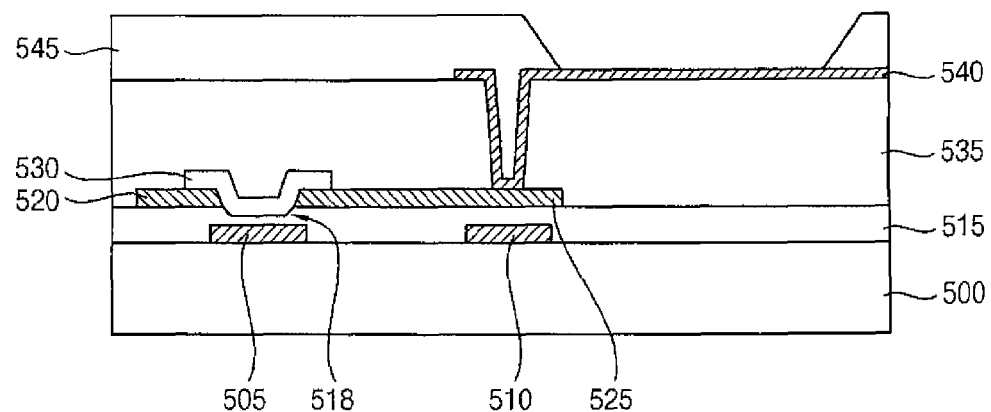

Referring to FIG. 27, a hole is formed through the insulation layer 535 to expose a portion of the drain electrode 525 of the oxide semiconductor device. For example, the hole of the insulation layer 535 may be obtained by a photolithography process.

A first electrode layer may be formed on the exposed portion of the drain electrode 525, a sidewall of the hole of the insulation layer 535 and the insulation layer 535. The first electrode layer may be uniformly formed on the drain electrode 525 and the insulation layer 535 along a profile of the hole of the insulation layer 535. The first electrode layer may be formed using a transparent conductive material, a transflective conductive material, a reflective conductive material, etc.

A first electrode 540 may be obtained by patterning the first electrode layer. The first electrode 540 may serve as a pixel electrode of the display device. The first electrode 540 may be formed on the exposed portion of the drain electrode 525, a sidewall of the hole of the insulation layer 535 and the insulation layer 535. Here, the first electrode 540 may not be positioned on a portion of the insulation layer 535 under which the oxide semiconductor device is located. In some example embodiments, a contact structure or a pad structure is formed on the exposed portion of the drain electrode 525 in the hole, so that the first electrode 540 is electrically connected to the oxide semiconductor device through the contact structure or the pad structure.

A pixel defining layer 545 is formed on the insulation layer 535 and the first electrode 540. The pixel defining layer 545 may be formed using an insulation material. For example, the pixel defining layer 545 may be formed using polyacryl-based resin, polyimide-based resin, a silica-based inorganic material, etc.

An opening is formed through the pixel defining layer 545 by partially etching the pixel defining layer 545, such that a portion of the first electrode 540 is exposed by the opening. For example, the opening may be obtained by a photolithography process. The opening of the pixel defining layer 545 may include an inclined sidewall having an angle (e.g., a predetermined angle) relative to the first substrate 500. A light emitting layer 550 and/or a second electrode 555 (see FIG. 28) may be easily formed on the first electrode 540 and the pixel defining layer 545 along the inclined sidewall of the opening of the pixel defining layer 545.

Figure 28:
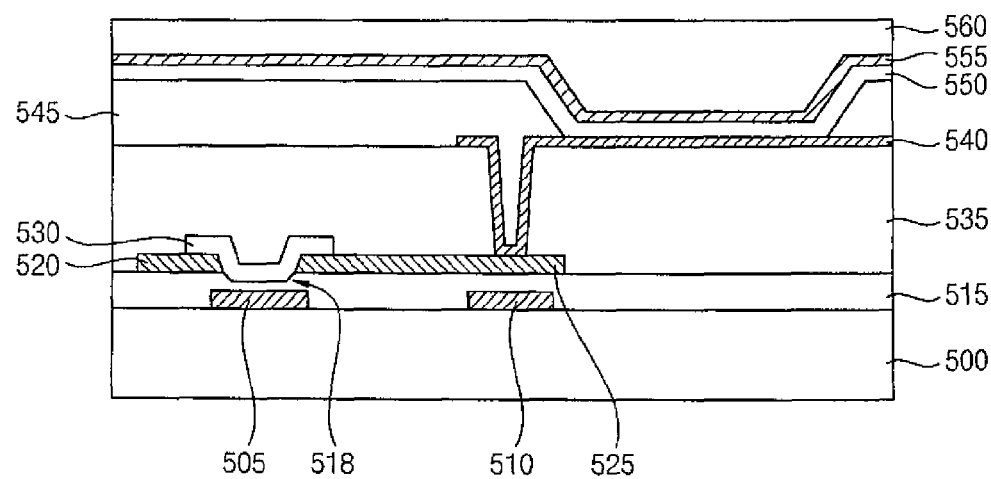

Referring to FIG. 28, the light emitting layer 550 is formed on the first electrode 540, the sidewall of the opening and the pixel defining layer 545. The light emitting layer 550 may be uniformly formed on the exposed portion of the first electrode 540, the sidewall of the opening and the pixel defining layer 545 along a profile of the opening. The light emitting layer 550 may be formed using an organic material having a relatively small molecular weight, an organic material having a relatively large molecular weight, etc. Further, the light emitting layer 550 may have a multi layer structure that includes an organic light emitting layer, a hole injection layer, a hole transport layer, an electron injection layer, an electron transport layer, etc.

A second electrode 555 is formed on the light emitting layer 550. The second electrode 555 may be formed using a transparent conductive material, a transflective conductive material, a reflective conductive material, etc. The second electrode 555 may be uniformly formed on the light emitting layer 550. In some example embodiment, when the light emitting layer 550 is formed on the first electrode 540 only, the second electrode 555 may also be formed in the opening of the pixel defining layer 545 only. For example, the light emitting layer 550 may be formed on the first electrode 540 and the sidewall of the opening, and the second electrode 555 may be formed on such light emitting layer 500. In this case, after forming a second electrode layer on the light emitting layer 500 and the pixel defining layer 545, the second electrode 555 may be obtained by pattering the second electrode layer.

A protection layer 560 is formed on the second electrode 550. The protection layer 560 may be formed a transparent insulation material such as glass, quarts, transparent plastic, transparent ceramic, etc. In some example embodiments, a second substrate substantially corresponding to the first substrate 500 may be provided on the protection layer 560. Here, the second substrate may include a transparent insulation material.

According to example embodiments, an oxide semiconductor device including a gate insulation layer having a recess structure may be employed in various display devices such as an organic light emitting display device, a liquid crystal display device, a flexible display device, etc. Therefore, the display device including the oxide semiconductor device may ensure a high quality of image and a high display speed while reducing a whole thickness of the display device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and their equivalents.

What is claimed is:

1. A method of manufacturing an oxide semiconductor device, comprising:
    forming a gate electrode on a substrate;
    forming a gate insulation layer on the substrate to cover the gate electrode;
    forming an electrode layer on the gate insulation layer;
    forming a mask pattern on the electrode layer;
    forming a source electrode and a drain electrode on the gate insulation layer by etching the electrode layer using the mask pattern;
    forming a preliminary recess structure on the gate insulation layer by performing a plasma treatment on the gate insulation layer between the source electrode and the drain electrode;
    forming a recess structure on the gate insulation layer by performing a cleaning treatment on the gate insulation layer having the preliminary recess structure;
    removing the mask pattern from the source electrode and the drain electrode; and
    forming an active pattern on the gate insulation layer, the source electrode and the drain electrode.

2. The method of claim 1, wherein the plasma treatment is carried out using a plasma generated from at least one gas selected from the group consisting of a gas including sulfur fluoride ($SF_x$), a gas including chlorine fluoride ($ClF_x$), a gas including hydrogen chloride (HCl), a gas including boron chloride ($BCl_x$), a gas including hydrocarbon ($C_xH_y$), a gas including oxygen ($O_2$) and a gas including ozone ($O_3$).

3. The method of claim 1, wherein the cleaning treatment is performed by applying a solution for removing a metal compound.

4. The method of claim 3, wherein the solution for removing the metal compound includes at least one solution selected from the group consisting of a solution containing hydrogen fluoride (HF), a solution containing hydrogen chloride (HCl), a solution containing phosphoric acid ($H_3PO_4$), a solution containing potassium hydroxide (KOH), a solution containing hydrogen bromide (HBr) and a solution containing iodine bromide (IBr).

5. A method of manufacturing an oxide semiconductor device, comprising:
    forming a gate electrode on a substrate;
    forming a gate insulation layer on the substrate to cover the gate electrode;
    forming an electrode layer on the gate insulation layer;
    forming a mask pattern on the electrode layer;
    forming a source electrode and a drain electrode on the gate insulation layer by etching the electrode layer using the mask pattern;
    forming a preliminary recess structure on the gate insulation layer by performing a plasma treatment on the gate insulation layer between the source electrode and the drain electrode;
    removing the mask pattern from the source electrode and the drain electrode;
    performing a cleaning treatment on the gate insulation layer having the preliminary recess structure; and
    forming an active pattern on the gate insulation layer, the source electrode and the drain electrode.

6. The method of claim 1, wherein the forming the electrode layer further comprises:
    forming a first electrode film on the gate insulation layer; and
    forming a second electrode film on the first electrode film.

7. A method of manufacturing an oxide semiconductor device, comprising:
    forming a gate electrode on a substrate;
    forming a gate insulation layer on the substrate to cover the gate electrode;
    forming an electrode layer on the gate insulation layer;
    forming a mask pattern on the electrode layer;
    forming a source electrode and a drain electrode on the gate insulation layer by etching the electrode layer using the mask pattern; and
    forming an active pattern on the gate insulation layer, the source electrode and the drain electrode,
    wherein the forming the electrode layer comprises forming a first electrode film on the gate insulation layer and forming a second electrode film on the first electrode film, and wherein the forming the second electrode film includes nitriding the first electrode film.

8. The method of claim 7, wherein the forming the second electrode film includes one of:
    thermally treating the first electrode film under an atmosphere containing nitrogen; and
    treating the first electrode film with a plasma generated from a gas containing nitrogen.

9. The method of claim 7, wherein the forming the source electrode and the drain electrode further comprises partially etching the second electrode film and the first electrode film to form a first electrode pattern and a second electrode pattern on a first portion of the gate insulation layer and to form a third electrode pattern and a fourth electrode pattern on a second portion of the gate insulation layer.

10. The method of claim 7, further comprising forming a recess structure on the gate insulation layer and between the source electrode and the drain electrode, the forming the recess structure comprising:
    removing the mask pattern from the source electrode and the drain electrode; and
    performing at least one of a plasma treatment or a cleaning treatment on the gate insulation layer between the source electrode and the drain electrode.

11. A method of manufacturing a display device, comprising:
    forming a gate electrode on a substrate;
    forming a gate insulation layer on the substrate to cover the gate electrode;
    forming an electrode layer on the gate insulation layer;
    forming a mask pattern on the electrode layer;
    forming a source electrode and a drain electrode on the gate insulation layer by etching the electrode layer using the mask pattern;
    forming a preliminary recess structure on the gate insulation layer by performing a plasma treatment on the gate insulation layer between the source electrode and the drain electrode;

forming a recess structure on the gate insulation layer by performing a cleaning treatment on the gate insulation layer having the preliminary recess structure;

removing the mask pattern from the source electrode and the drain electrode;

forming an active pattern on the gate insulation layer, the source electrode and the drain electrode;

forming a first electrode electrically connected to the drain electrode;

forming a light emitting layer on the first electrode; and forming a second electrode on the light emitting layer.

12. A method of manufacturing a display device, comprising:

forming a gate electrode on a substrate;

forming a gate insulation layer on the substrate to cover the gate electrode;

forming an electrode layer on the gate insulation layer;

forming a mask pattern on the electrode layer;

forming a source electrode and a drain electrode on the gate insulation layer by etching the electrode layer using the mask pattern;

forming a preliminary recess structure on the gate insulation layer by performing a plasma treatment on the gate insulation layer between the source electrode and the drain electrode;

removing the mask pattern from the source electrode and the drain electrode;

performing a cleaning treatment on the gate insulation layer having the preliminary recess structure;

forming an active pattern on the gate insulation layer, the source electrode and the drain electrode;

forming a first electrode electrically connected to the drain electrode;

forming a light emitting layer on the first electrode; and forming a second electrode on the light emitting layer.

13. A method of manufacturing a display device, comprising:

forming a gate electrode on a substrate;

forming a gate insulation layer on the substrate to cover the gate electrode;

forming an electrode layer on the gate insulation layer;

forming a mask pattern on the electrode layer;

forming a source electrode and a drain electrode on the gate insulation layer by etching the electrode layer using the mask pattern;

forming an active pattern on the gate insulation layer, the source electrode and the drain electrode;

forming a first electrode electrically connected to the drain electrode;

forming a light emitting layer on the first electrode; and forming a second electrode on the light emitting layer, wherein the forming the electrode layer further comprises:

forming a first electrode film on the gate insulation layer; and forming a second electrode film on the first electrode film by nitriding the first electrode film, and wherein the forming the source electrode and the drain electrode further comprises:

partially etching the second electrode film and the first electrode film to form a first electrode pattern and a second electrode pattern on a first portion of the gate insulation layer and to form a third electrode pattern and a fourth electrode pattern on a second portion of the gate insulation layer, and wherein the forming the recess structure further comprises:

removing the mask pattern from the source electrode and the drain electrode; and performing at least one of a plasma treatment or a cleaning treatment on the gate insulation layer between the source electrode and the drain electrode.

* * * * *